(12) United States Patent
Lin et al.

(10) Patent No.: US 10,326,438 B2
(45) Date of Patent: Jun. 18, 2019

(54) DRIVING CIRCUIT OF A POWER CIRCUIT AND A REGULATOR

(71) Applicant: Delta Electronics, Inc., Taoyuan (TW)

(72) Inventors: Ting-Chieh Lin, Taoyuan (TW); Chang-Jing Yang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 145 days.

(21) Appl. No.: 15/495,009

(22) Filed: Apr. 24, 2017

(65) Prior Publication Data

US 2018/0191244 A1 Jul. 5, 2018

Related U.S. Application Data

(63) Continuation-in-part of application No. 15/395,738, filed on Dec. 30, 2016, now Pat. No. 9,906,221.

(51) Int. Cl.
| | |
|---|---|
| *H03K 17/16* | (2006.01) |
| *H03K 17/687* | (2006.01) |
| *H02M 1/44* | (2007.01) |
| *H02M 1/08* | (2006.01) |
| *H03F 3/45* | (2006.01) |
| *H02M 3/158* | (2006.01) |
| *H03K 17/06* | (2006.01) |
| *H02M 1/00* | (2006.01) |
| *H03K 3/3565* | (2006.01) |

(52) U.S. Cl.
CPC ............ *H03K 17/161* (2013.01); *H02M 1/08* (2013.01); *H02M 1/44* (2013.01); *H02M 3/1588* (2013.01); *H03F 3/45475* (2013.01); *H03K 17/063* (2013.01); *H03K 17/6871* (2013.01); *H02M 2001/0006* (2013.01); *H03F 3/45* (2013.01); *H03K 3/3565* (2013.01); *H03K 2217/0063* (2013.01); *H03K 2217/0072* (2013.01); *H03K 2217/0081* (2013.01); *Y02B 70/1466* (2013.01)

(58) Field of Classification Search
CPC ............... H03K 17/161; H03K 17/063; H03K 17/6871; H03K 2217/0063; H03K 2217/0072; H03K 2217/0081; H02M 1/08; H02M 1/44
USPC ........ 327/108–112, 427, 434, 437, 538–543, 327/306–333, 50–97; 326/82, 83, 87
See application file for complete search history.

(56) References Cited

U.S. PATENT DOCUMENTS

| | | | | |
|---|---|---|---|---|
| 5,648,735 A | * | 7/1997 | Bowers | ................ H03K 5/2418 327/307 |
| 6,515,461 B2 | * | 2/2003 | Akiyama | ................ G05F 1/465 323/313 |

(Continued)

*Primary Examiner* — Thomas Skibinski
(74) *Attorney, Agent, or Firm* — Muncy, Geissler, Olds & Lowe, P.C.

(57) ABSTRACT

A regulator converting an input voltage into a supply voltage includes a first differential amplifier, a second differential amplifier, a pass element, and a feedback voltage divider. The first differential amplifier includes a reference voltage with a feedback voltage to generate a first output voltage and a first inverse output voltage. The second differential amplifier compares the first output voltage and the first inverse output voltage to generate a second output voltage. The pass element passes an output current from the input voltage to the supply voltage according to the second output voltage. The feedback voltage divider divides the supply voltage by a feedback factor to generate the feedback voltage.

41 Claims, 17 Drawing Sheets

(56) References Cited

U.S. PATENT DOCUMENTS

| | | | | |
|---|---|---|---|---|
| 7,606,085 B2* | 10/2009 | Wada | ............... | G11C 5/147 |
| | | | | 327/540 |
| 7,986,180 B2* | 7/2011 | Lee | ............... | G05F 1/465 |
| | | | | 327/540 |
| 2008/0157830 A1* | 7/2008 | Kume | ............... | H03K 4/066 |
| | | | | 327/110 |
| 2009/0039950 A1* | 2/2009 | Takeuchi | ............... | G11C 5/145 |
| | | | | 327/541 |
| 2012/0049899 A1* | 3/2012 | Notani | ............... | G05F 1/56 |
| | | | | 327/109 |

* cited by examiner

DRIVING CIRCUIT OF A POWER CIRCUIT AND A REGULATOR

CROSS REFERENCE TO RELATED APPLICATIONS

The present application is a continuation-in-part of and claims priority from U.S. patent application Ser. No. 15/395,738, filed Dec. 30, 2016, the content of which is hereby incorporated by reference in its entirety.

BACKGROUND OF THE INVENTION

Field of the Invention

The disclosure relates generally to a driving circuit integrated with a GaN power device, and more particularly it relates to a driving circuit integrated with a GaN power device and a GaN regulator.

Description of the Related Art

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, such that the first power transistor 110A can be fully turned on. Therefore, the first power transistor 110A supplied by the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfere with the boost voltage VB when the boost capacitor CB is charged through the power transistor. Therefore, it is necessary to eliminate parasitic effects from the driving circuit.

BRIEF SUMMARY OF THE INVENTION

In an embodiment, a regulator for converting an input voltage into a supply voltage is provided, which comprises a first differential amplifier, a second differential amplifier, a pass element, and a feedback voltage divider. The first differential amplifier compares a reference voltage with a feedback voltage to generate a first output voltage at a first output node and a first inverse output voltage at a first inverse output node. The second differential amplifier compares the first output voltage and the first inverse output voltage to generate a second output voltage. The pass element passes an output current from the input voltage to the supply voltage according to the second output voltage at a second output node. The feedback voltage divider divides the supply voltage by a feedback factor to generate the feedback voltage.

According to an embodiment of the invention, the regulator further comprises a reference voltage divider. The reference voltage divider divides the input voltage by a reference factor to generate the reference voltage.

According to an embodiment of the invention, the first differential amplifier comprises a first N-type transistor, a first resistor, a second N-type transistor, a second resistor, and a first current source. The first N-type transistor comprises a gate terminal receiving the reference voltage, a source terminal coupled to a first node, and a drain terminal coupled to the first inverse output node. The first resistor is coupled between the input voltage and the first inverse output node. The second N-type transistor comprises a gate terminal receiving the feedback voltage, a source terminal coupled to the first node, and a drain terminal coupled to the first output node. The second resistor is coupled between the input voltage and the first output node. The first current source sinks a first current from the first node to a ground.

According to an embodiment of the invention, the second differential amplifier comprises a third N-type transistor, a third resistor, a fourth N-type transistor, a fourth resistor, and a second current source. The third N-type transistor comprises a gate terminal receiving the first output voltage, a source terminal coupled to a second node, and a drain terminal coupled to a second inverse output node. The third resistor is coupled between the input voltage and the second inverse output node. The fourth N-type transistor comprises a gate terminal receiving the first inverse output voltage, a source terminal coupled to the second node, and a drain terminal coupled to the second output node. The fourth resistor is coupled between the input voltage and the second output node. The second current source sinks a second current from the second node to the ground.

According to an embodiment of the invention, the second differential amplifier further comprises a first clamp circuit and a second clamp circuit. The first clamp circuit comprises a positive clamp node coupled to the first output node and a negative clamp node coupled to the second node, which is configured to clamp a voltage between the gate terminal and the source terminal of the third N-type transistor. The second clamp circuit comprises a positive clamp node coupled to the first inverse output node and a negative clamp node coupled to the second node, which is configured to clamp a voltage between the gate terminal and the source terminal of the fourth N-type transistor.

According to an embodiment of the invention, the pass element comprises a pass N-type transistor and a third clamp circuit. The pass N-type transistor comprises a gate terminal receiving the second output voltage, a source terminal coupled to the supply voltage, and a drain terminal receiving the input voltage. The third clamp circuit comprises a positive clamp node coupled to the gate terminal and a negative clamp node coupled to the source terminal of the pass N-type transistor, which is configured to clamp a voltage between the gate terminal and the source terminal of the pass N-type transistor.

According to an embodiment of the invention, each of the first clamp circuit, the second clamp circuit, and the third clamp circuit comprises a first clamp N-type transistor and a second clamp N-type transistor. The first clamp N-type transistor comprises a gate terminal coupled to the positive clamp node, a source terminal, and a drain terminal coupled to the positive clamp node. The second clamp N-type transistor comprises a gate terminal and a drain terminal coupled to the source terminal of the first clamp node and a source terminal coupled to the negative clamp node, wherein each of the first clamp N-type transistor and the second clamp N-type transistor is a GaN transistor.

According to an embodiment of the invention, the regulator is implemented by a GaN process.

In an embodiment, a circuit comprises a regulator and a power circuit. The regulator, which converts an input voltage into a supply voltage, comprises a first differential amplifier, a second differential amplifier, a pass element, and a feedback voltage divider. The first differential amplifier compares a reference voltage with a feedback voltage to generate a first output voltage at a first output node and a first inverse output voltage at a first inverse output node. The second differential amplifier compares the first output voltage and a first inverse output voltage to generate a second output voltage. The pass element passes an output current from the input voltage to the supply voltage according to the second output voltage at a second output node. The feedback voltage divider divides the supply voltage by a feedback factor to generate the feedback voltage. The power circuit, which is supplied by the supply voltage, comprises a power transistor and a driving circuit. The power transistor passes a power current to a ground according to a drive voltage of a drive node. The driving circuit generates the driving voltage according to a control signal.

According to an embodiment of the invention, the regulator further comprises a reference voltage divider. The reference voltage divider divides the input voltage by a reference factor to generate the reference voltage.

According to an embodiment of the invention, the first differential amplifier comprises a first N-type transistor, a first resistor, a second N-type transistor, a second resistor, and a first current source. The first N-type transistor comprises a gate terminal receiving the reference voltage, a source terminal coupled to a first node, and a drain terminal coupled to the first inverse output node. The first resistor is coupled between the input voltage and the first inverse output node. The second N-type transistor comprises a gate terminal receiving the feedback voltage, a source terminal coupled to the first node, and a drain terminal coupled to the first output node. The second resistor is coupled between the input voltage and the first output node. The first current source sinks a first current from the first node to a ground.

According to an embodiment of the invention, the second differential amplifier comprises a third N-type transistor, a third resistor, a fourth N-type transistor, a fourth resistor, and a second current source. The third N-type transistor comprises a gate terminal receiving the first output voltage, a source terminal coupled to a second node, and a drain terminal coupled to a second inverse output node. The third resistor is coupled between the input voltage and the second inverse output node. The fourth N-type transistor comprises a gate terminal receiving the first inverse output voltage, a source terminal coupled to the second node, and a drain terminal coupled to the second output node. The fourth resistor is coupled between the input voltage and the second output node. The second current source sinks a second current from the second node to the ground.

According to an embodiment of the invention, the second differential amplifier further comprises a first clamp circuit and a second clamp circuit. The first clamp circuit comprises a positive clamp node coupled to the first output node and a negative clamp node coupled to the second node, which is configured to clamp a voltage between the gate terminal and the source terminal of the third N-type transistor. The second clamp circuit comprises a positive clamp node coupled to the first inverse output node and a negative clamp node coupled to the second node, which is configured to clamp a voltage between the gate terminal and the source terminal of the fourth N-type transistor.

According to an embodiment of the invention, the pass element comprises a pass N-type transistor and a third clamp circuit. The pass N-type transistor comprises a gate terminal receiving the second output voltage, a source terminal coupled to the supply voltage, and a drain terminal receiving the input voltage. The third clamp circuit comprises a positive clamp node coupled to the gate terminal and a negative clamp node coupled to the source terminal of the pass N-type transistor, which is configured to clamp a voltage between the gate terminal and the source terminal of the pass N-type transistor.

According to an embodiment of the invention, each of the first clamp circuit, the second clamp circuit, and the third clamp circuit comprises a first clamp N-type transistor and a second clamp N-type transistor. The first clamp N-type transistor comprises a gate terminal coupled to the positive clamp node, a source terminal, and a drain terminal coupled to the positive clamp node. The second clamp N-type transistor comprises a gate terminal and a drain terminal coupled to the source terminal of the first clamp node and a source terminal coupled to the negative clamp node, wherein each of the first clamp N-type transistor and the second clamp N-type transistor is a GaN transistor.

According to an embodiment of the invention, the regulator is implemented by a GaN process.

According to an embodiment of the invention, the driving circuit comprises a high-side transistor, a low-side transistor, and a charge pump. The high-side transistor provides the supply voltage to the drive node according to a high-side voltage of a high-side node. The low-side transistor couples the drive node to the ground according to the control signal. The charge pump is coupled to the high-side node and the drive node, which is configured to generate a high-side voltage that exceeds the supply voltage according to the control signal.

According to an embodiment of the invention, the high-side transistor and the low-side transistor are normally-off transistors.

According to an embodiment of the invention, the power transistor is a GaN transistor.

According to an embodiment of the invention, the charge pump comprises a first unidirectional conducting device, a capacitor, a discharge resistor, a second unidirectional conducting device, a third unidirectional conducting device, and a switch. The first unidirectional conducting device unidirectionally provides the supply voltage to a first node. The capacitor is coupled between the first node and a second node. The discharge resistor is coupled between the first node and the high-side node. The second unidirectional conducting device unidirectionally couples the second node to the high-side node when a voltage of the second node exceeds a voltage of the high-side node. The third unidirectional conducting device unidirectionally provides the drive voltage to the second node when the drive voltage exceeds the voltage of the second node. The switch receives the control signal, which is configured to couple the high-side node to the ground according to the control signal.

According to an embodiment of the invention, when the control signal is at a high voltage level, the switch is turned ON and the capacitor is charged by the supply voltage through the first unidirectional conducting device, the second unidirectional conducting device, and the switch. When the control signal is at a low voltage level, the switch is turned OFF, the third unidirectional conducting device provides the drive voltage to the second node, and the capacitor is discharged to the drive node through the discharge resistor.

According to an embodiment of the invention, each of the first unidirectional conducting device, the second unidirectional conducting device, and the third unidirectional conducting device is a diode or a diode-connected normally-off transistor.

According to an embodiment of the invention, the driving circuit further comprises a high-side normally-on transistor. The high-side normally-on transistor comprises a source terminal coupled to the drive node, a gate terminal coupled to the drive node, and a drain terminal supplied by the supply voltage, which is configured to improve driving capability of the high-side transistor.

According to an embodiment of the invention, the power circuit further comprises a first pre-driver. The first pre-driver is coupled between the control signal and the driving circuit, which is configured to improve driving capability of the control signal. The first pre-driver comprises a first normally-on transistor and a first normally-off transistor. The first normally-on transistor comprises a gate terminal coupled to the driving circuit, a source terminal coupled to the driving circuit, and a drain terminal supplied by the supply voltage. The first normally-off transistor comprises a gate terminal receiving the control signal, a source terminal coupled to the ground, and a drain terminal coupled to the driving circuit.

According to an embodiment of the invention, the driving circuit further comprises a second pre-driver. The second pre-driver is coupled between the control signal and the first pre-driver, which comprises a second normally-on transistor and a second normally-off transistor. The second normally-on transistor comprises a gate terminal coupled to the gate terminal of the first normally-off transistor, a source terminal coupled to the gate terminal of the first normally-off transistor, and a drain terminal supplied by the supply voltage. The second normally-off transistor comprises a gate terminal receiving the control signal, a source terminal coupled to the ground, and a drain terminal coupled to the gate terminal of the first normally-off transistor.

According to an embodiment of the invention, the driving circuit further comprises a hysteresis circuit. The hysteresis circuit is coupled between the control signal and the second pre-driver, which comprises a first resistor, a third normally-off transistor, a fourth normally-off transistor, a fifth normally-off transistor, and a second resistor. The first resistor is coupled to the supply voltage. The third normally-off transistor comprises a gate terminal coupled to a third node, a source terminal coupled to a fourth node, and a drain terminal coupled to the first resistor. The fourth normally-off transistor comprises a gate terminal coupled to the third node, a source terminal coupled to the ground, and a drain terminal coupled to the fourth node. The fifth normally-off transistor comprises a gate terminal coupled to the first resistor, a source terminal coupled to the fourth node, and a drain terminal supplied by the supply voltage. The second resistor is coupled to the third node and receiving the control signal.

According to another embodiment of the invention, the driving circuit comprises a first bootstrap circuit, a second bootstrap circuit, a pre-driver, and a hysteresis circuit. The first bootstrap circuit comprises a high-side transistor, a low-side transistor, and a charge pump. The high-side transistor provides a supply voltage to the driving node according to a high-side voltage of a high-side node. The low-side transistor electrically connects the driving node to the ground according to a first internal signal. The charge pump is coupled to the high-side node and the driving node, which is configured to generate the high-side voltage that exceeds the supply voltage according to the first internal signal and a second internal signal. The second bootstrap circuit receives the second internal signal to generate the first internal signal at a first internal node. The pre-driver receives a third internal signal to generate the second internal signal at a second internal node, in which the second bootstrap circuit and the pre-driver are configured to improve driving capability of the control signal. The hysteresis circuit receives a control signal to generate the third internal signal at a third internal node and configured to provide a hysteresis for the control signal.

According to an embodiment of the invention, the high-side transistor and the low-side transistor are normally-off transistors.

According to an embodiment of the invention, the power transistor is a GaN transistor.

According to another embodiment of the invention, the charge pump comprises a first normally-on transistor, a feedback normally-off transistor, a first switch, a first normally-off transistor, a second normally-off transistor, a first capacitor, a third normally-off transistor, and a fourth normally-off transistor. The first normally-on transistor comprises a source terminal, a gate terminal, and a drain terminal, in which the source terminal and the gate terminal are coupled to a feedback node, and the drain terminal is supplied by the supply voltage. The feedback normally-off transistor comprises a source terminal, a gate terminal, and a drain terminal, in which the source terminal is coupled to the ground, the gate terminal is coupled to the driving node, and the drain terminal is coupled to the feedback node. The first switch is configured to electrically connect a first node to the ground according to a voltage of the feedback node. The first normally-off transistor comprises a source terminal, a gate terminal, and a drain terminal, in which the source terminal is coupled to the first node, the gate terminal is coupled to the high-side node, and the drain terminal is supplied by the supply voltage. The second normally-off transistor comprises a source terminal, a gate terminal, and a drain terminal, in which the source terminal is coupled to the ground, the gate terminal receives the first internal signal, and the drain terminal is coupled to the first node. The first capacitor is coupled between the first node and the high-side node. The third normally-off transistor comprises a source terminal, a gate terminal, and a drain terminal, in which the source terminal is coupled to the high-side node, the gate terminal receives the second internal signal, and the drain terminal is supplied by the supply voltage. The fourth normally-off transistor comprises a source terminal, a gate terminal, and a drain terminal, in which the source terminal is coupled to the ground, the gate terminal receives the first internal signal, and the drain terminal is coupled to the high-side node.

According to an embodiment of the invention, when the second internal signal is at a high voltage level, the first internal signal is at a low voltage level, and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor. When the high-side voltage is raised to turn ON the first normally-off transistor, a voltage of the first node is raised to boost the high-side voltage for fully turning ON the high-side transistor, wherein when the driving voltage is raised to turn ON the feedback normally-off transistor, the first switch is turned OFF, such that the voltage of the first node is raised to the supply voltage.

According to an embodiment of the invention, the second bootstrap circuit comprises a fifth normally-off transistor, a sixth normally-off transistor, a second capacitor, a first unidirectional conducting device, a first resistor, and a second switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second capacitor is coupled between a third node and the first internal node. The first unidirectional conducting device unidirectionally provides the supply voltage to the third node. The first resistor is coupled between the second node and the third node. The second switch is configured to electrically connect the second node to the ground according to the second internal signal.

According to an embodiment of the invention, when the second internal signal is at a high voltage level, the sixth normally-off transistor and the second switch are turned ON and the second capacitor is charged by the supply voltage through the first unidirectional conducting device and the sixth normally-off transistor. When the second internal signal is at a low voltage level, the sixth normally-off transistor and the second switch are turned OFF, the first resistor provides a voltage of the third node to the second node to turn ON the fifth normally-off transistor. When the fifth normally-off transistor is turned ON to raise the first internal signal, the voltage of the third node is equal to the sum of a voltage across the second capacitor and the first internal signal for fully turning ON the fifth transistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to another embodiment of the invention, the second bootstrap circuit comprises a fifth normally-off transistor, a sixth normally-off transistor, a second unidirectional conducting device, a third capacitor, a discharge resistor, a third unidirectional conducting device, a fourth unidirectional conducting device, and a third switch. The fifth normally-off transistor comprises a source terminal, a gate terminal, and a drain terminal, in which the source terminal is coupled to the first internal node, the gate terminal is coupled to a second node, and the drain terminal is supplied by the supply voltage. The sixth normally-off transistor comprises a source terminal, a gate terminal, and a drain terminal, in which the source terminal is coupled to the ground, the gate terminal receives the second internal signal, and the drain terminal is coupled to the first internal node. The second unidirectional conducting device unidirectionally provides the supply voltage to a third node. The third capacitor is coupled between the third node and a charge node. The discharge resistor is coupled between the second node and the third node. The third unidirectional conducting device unidirectionally electrically connects the charge node to the second node when a voltage of the charge node exceeds a voltage of the second node. The fourth unidirectional conducting device unidirectionally provides the first internal signal to the charge node when the first internal signal exceeds a voltage of the charge node. The third switch receives the control signal, which is configured to couple the high-side node to the ground according to the control signal.

According to an embodiment of the invention, each of the second unidirectional conducting device, the third unidirectional conducting device, and the fourth unidirectional conducting device is a diode or a diode-connected normally-off transistor.

According to an embodiment of the invention, when the second internal signal is at a high voltage level, the third switch is turned ON and the third capacitor is charged by the supply voltage through the second unidirectional conducting device, the third unidirectional conducting device, and the third switch. When the second internal signal is at a low voltage level, the third switch is turned OFF, the fourth unidirectional conducting device provides the first internal signal to the charge node, and the third capacitor is discharged to the second node through the discharge resistor.

According to an embodiment of the invention, the second bootstrap circuit further comprises a second normally-on transistor. The second normally-on transistor comprises a source terminal, a gate terminal, and a drain terminal, in which the source terminal and the gate terminal are coupled to the first internal node and the drain terminal is supplied by the supply voltage. The second normally-on transistor is configured to improve the driving capability of the fifth normally-off transistor.

According to an embodiment of the invention, the first bootstrap circuit further comprises a high-side normally-on transistor. The high-side normally-on transistor comprises a source terminal coupled to the driving node, a gate terminal coupled to the driving node, and a drain terminal supplied by the supply voltage, which is configured to improve the driving capability of the high-side transistor.

According to an embodiment of the invention, the pre-driver comprises a driving normally-on transistor and a seventh normally-off transistor. The driving normally-on transistor comprises a source terminal, a gate terminal, and a drain terminal, in which the gate terminal and the source terminal are coupled to the second internal node and the drain terminal is supplied by the supply voltage. The seventh normally-off transistor comprises a source terminal, a gate terminal, and a drain terminal, in which the gate terminal receives the third internal signal, a source terminal is coupled to the ground, and the drain terminal is coupled to the second internal node.

According to an embodiment of the invention, the hysteresis circuit comprises a second resistor, an eighth normally-off transistor, a ninth normally-off transistor, a tenth normally-off transistor, and a third resistor. The second resistor is coupled between the supply voltage and the third internal node. The eighth normally-off transistor comprises a gate terminal coupled to a fourth node, a source terminal coupled to a fifth node, and a drain terminal coupled to the second resistor. The ninth normally-off transistor comprises a gate terminal coupled to the fourth node, a source terminal coupled to the ground, and a drain terminal coupled to the fifth node. The tenth normally-off transistor comprises a gate terminal coupled to the drain terminal of the eighth normally-off transistor, a source terminal coupled to the fifth node, and a drain terminal supplied by the supply voltage. The third resistor provides the control signal to the fourth node.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
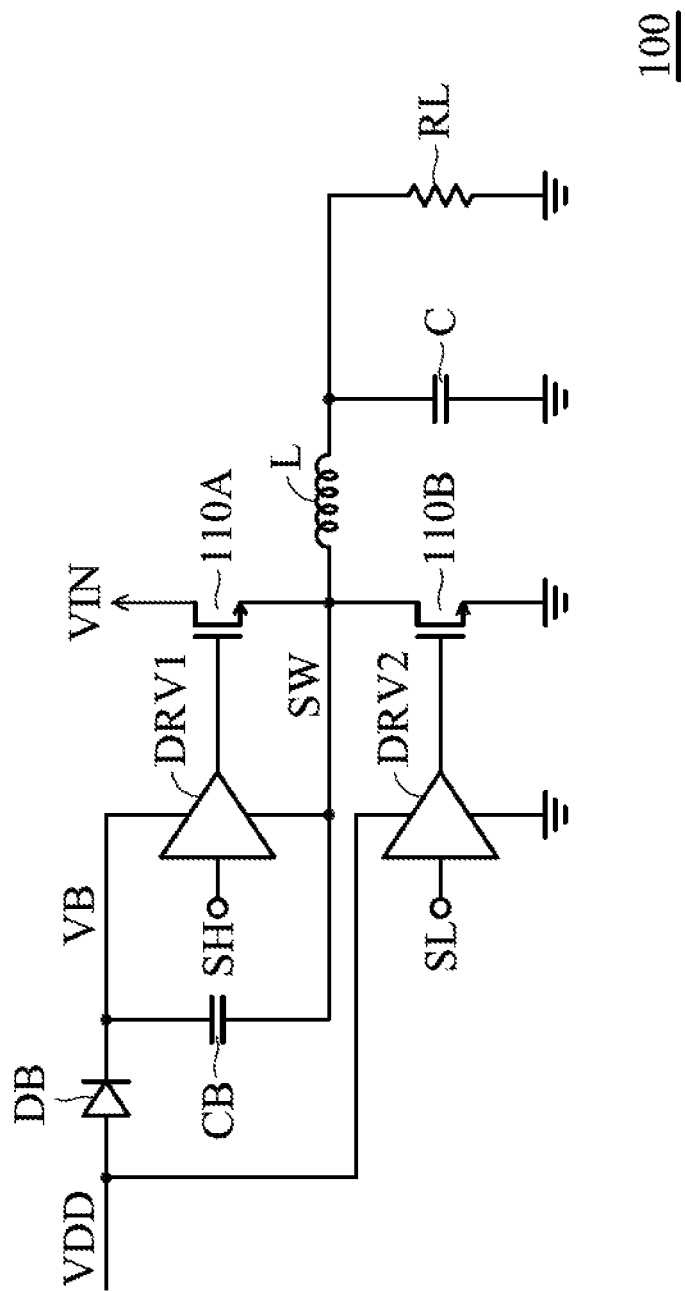
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 2:
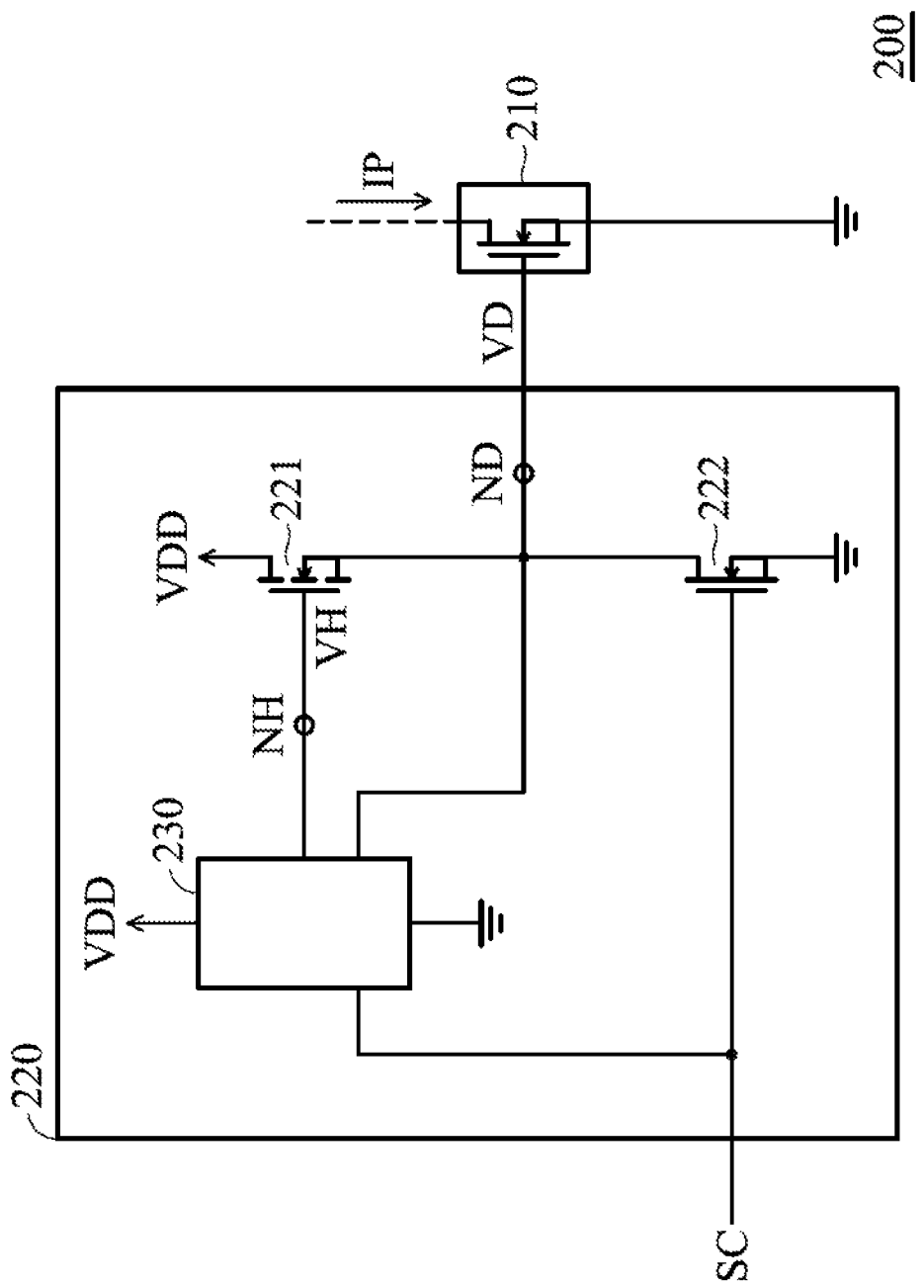
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a driving circuit 220. The power transistor 210 passes the power current IP to the ground according to the driving voltage VD of the driving node ND. According to an embodiment of the invention, the power transistor 210 is a GaN transistor.

The driving circuit 220 includes a high-side transistor 221, a low-side transistor 222, and a charge pump 230. The high-side transistor 221 supplies the supply voltage VDD to the driving node ND according to the high-side voltage VH of the high-side node NH. The low-side transistor 222 is coupled between the driving node ND and the ground, and is configured to pull the driving voltage VD down to the ground according to the control signal SC. According to an embodiment of the invention, the high-side transistor 221 and the low-side transistor 222 are normally-off transistors.

The charge pump 230 is supplied by the supply voltage VDD and the ground and is coupled to the high-side node NH and the driving node ND. For the sake of fully turning on the high-side transistor 221, the charge pump 230 is configured to generate the high-side voltage VH exceeding the supply voltage VDD, such that the gate-to-source voltage of the high-side transistor 221 at least exceeds the threshold voltage to apply the supply voltage VDD to the driving node ND. According to an embodiment of the invention, the driving circuit 220 is a rail-to-rail driver, such that the driving voltage VD ranges from the supply voltage VDD to the ground level.

Figure 3:
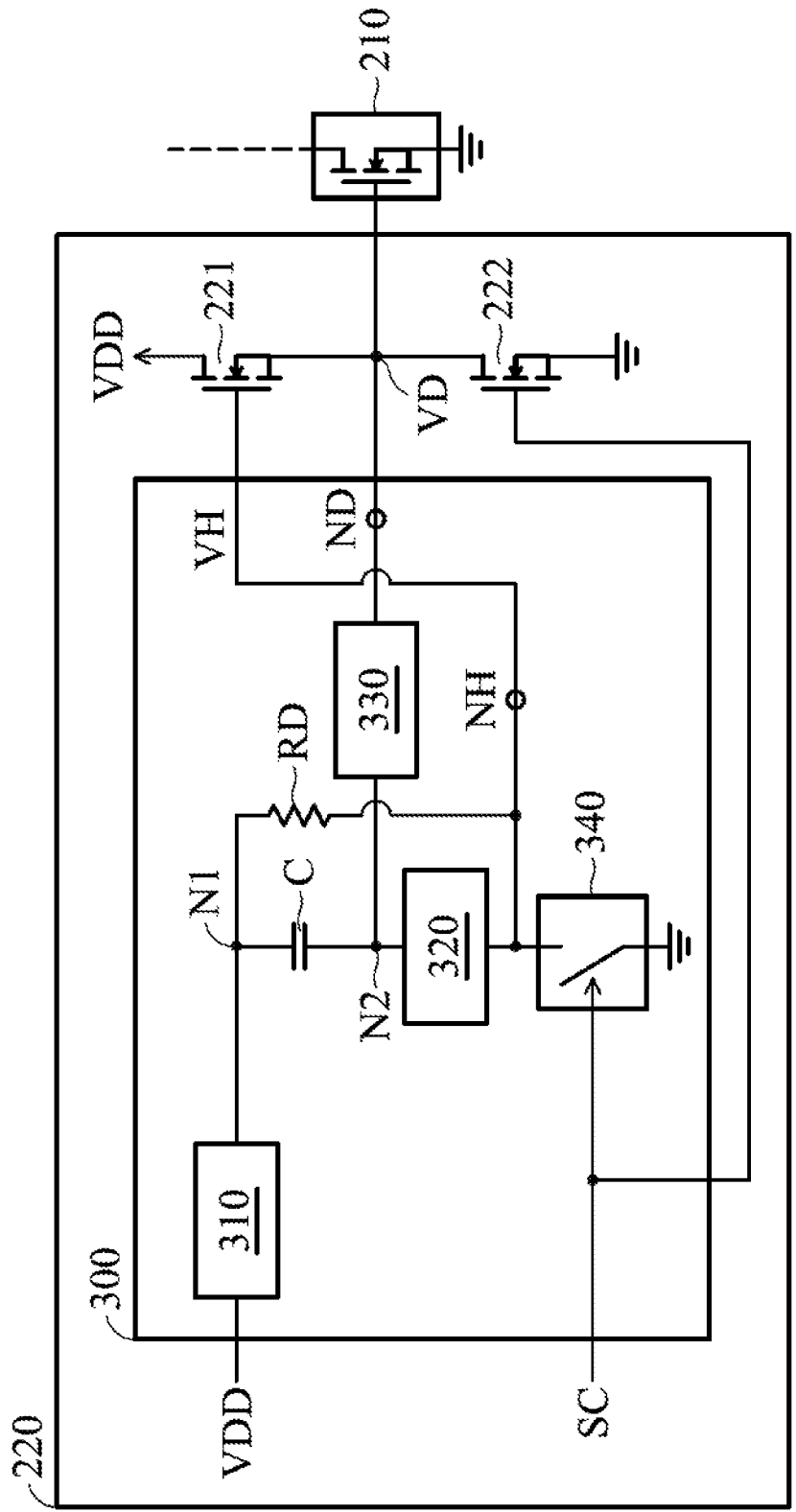
FIG. 3 shows a schematic diagram of the charge pump in the power circuit 200 of FIG. 2 in accordance with the invention.

FIG. 3 shows a schematic diagram of the charge pump in the power circuit 200 of FIG. 2 in accordance with the invention. As shown in FIG. 3, the charge pump 300, which is coupled to the driving node ND and the high-side node NH, includes a first unidirectional conducting device 310, a discharge resistor RD, a capacitor C, a second unidirectional conducting device 320, a third unidirectional conducting device 330, and a switch 340.

When the supply voltage VDD exceeds the voltage of the first node N1, the first unidirectional conducting device 310 is turned ON. When the voltage VDD does not exceed the voltage of the first node N1, the first unidirectional conducting device 310 is turned OFF. The capacitor C is coupled between the first node N1 and the second node N2. The discharge resistor RD is coupled between the first node N1 and the high-side node NH.

The second unidirectional conducting device 320 is coupled between the second node N2 and the high-side node NH. When the voltage of the second node N2 exceeds the high-side voltage VH, the second unidirectional conducting device 320 is turned ON. When the voltage of the second node N2 does not exceed the high-side voltage VH, the second unidirectional conducting device 320 is turned OFF.

The third unidirectional conducting device 330 is coupled between the driving node ND and the second node N2. When the driving voltage VD of the driving node ND exceeds the voltage of the second node N2, the third unidirectional conducting device 330 is turned ON. When the driving voltage VD does not exceed the voltage of the second node N2, the third unidirectional conducting device 330 is turned OFF.

The switch 340 receives the control signal SC and is coupled between the high-side node NH and the ground. In addition, the switch 340 is configured to couple the high-side node NH to the ground according to the control signal SC.

For the simplicity of illustration, the switch 340 is illustrated herein as an N-type transistor. According to an embodiment of the invention, when the control signal SC is at the high voltage level, such as the supply voltage VDD, the switch 340 is turned ON and the capacitor C is charged by the supply voltage VDD through the first unidirectional conducting device 310, the second unidirectional conducting device 320, and the switch 340 to the ground.

According to another embodiment of the invention, when the control signal SC is at the low voltage level, such as the ground level, the switch 340 is turned OFF and the third unidirectional conducting device 330 provides the driving voltage VD to the second node N2, such that the capacitor C is discharged to the driving node ND through the discharge resistor RD.

According to an embodiment of the invention, the resistance of the discharge resistor RD determines the maximum voltage that the capacitor C can be charged to and also the maximum voltage that the high-side voltage VH can achieve. In addition, the greater the resistance of the discharge resistor RD, the slower the rising speed that can be achieved by the high-side voltage VD. Therefore, there is a trade-off in the resistance of the discharge resistor RD.

According to an embodiment of the invention, each of the first unidirectional conducting device 310, the second unidirectional conducting device 320, and the third unidirectional conducting device 330 is a diode. According to another embodiment of the invention, each of the first unidirectional conducting device 310, the second unidirectional conducting device 320, and the third unidirectional conducting device 330 is a diode-connected normally-off transistor.

Figure 4:
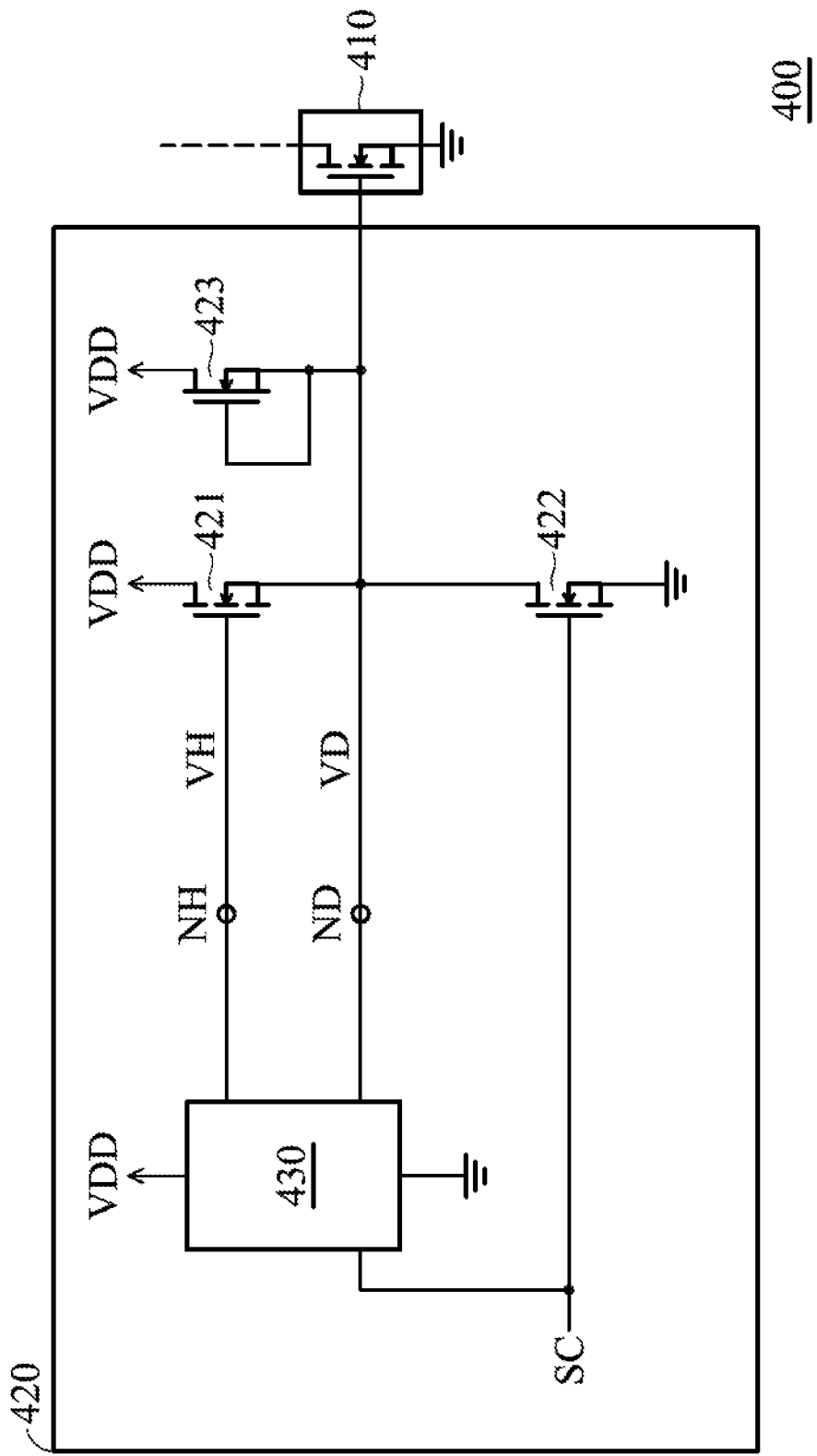
FIG. 4 shows a block diagram of a power circuit in accordance with another embodiment of the invention.

FIG. 4 shows a block diagram of a power circuit in accordance with another embodiment of the invention. As shown in FIG. 4, the power circuit 400 includes a power transistor 410 and a driving circuit 420, in which the power transistor 410 and the driving circuit 420 respectively correspond to the power transistor 210 and the driving circuit 220 in FIG. 2.

The driving circuit 420 further includes a high-side normally-on transistor 423. The source terminal and the gate terminal of the high-side normally-on transistor 423 are coupled to the driving node ND, and the drain terminal of the high-side normally-on transistor 423 is supplied by the supply voltage VDD. The high-side normally-on transistor 423 is always turned on to improve the driving capability of the high-side transistor 421.

Figure 5:
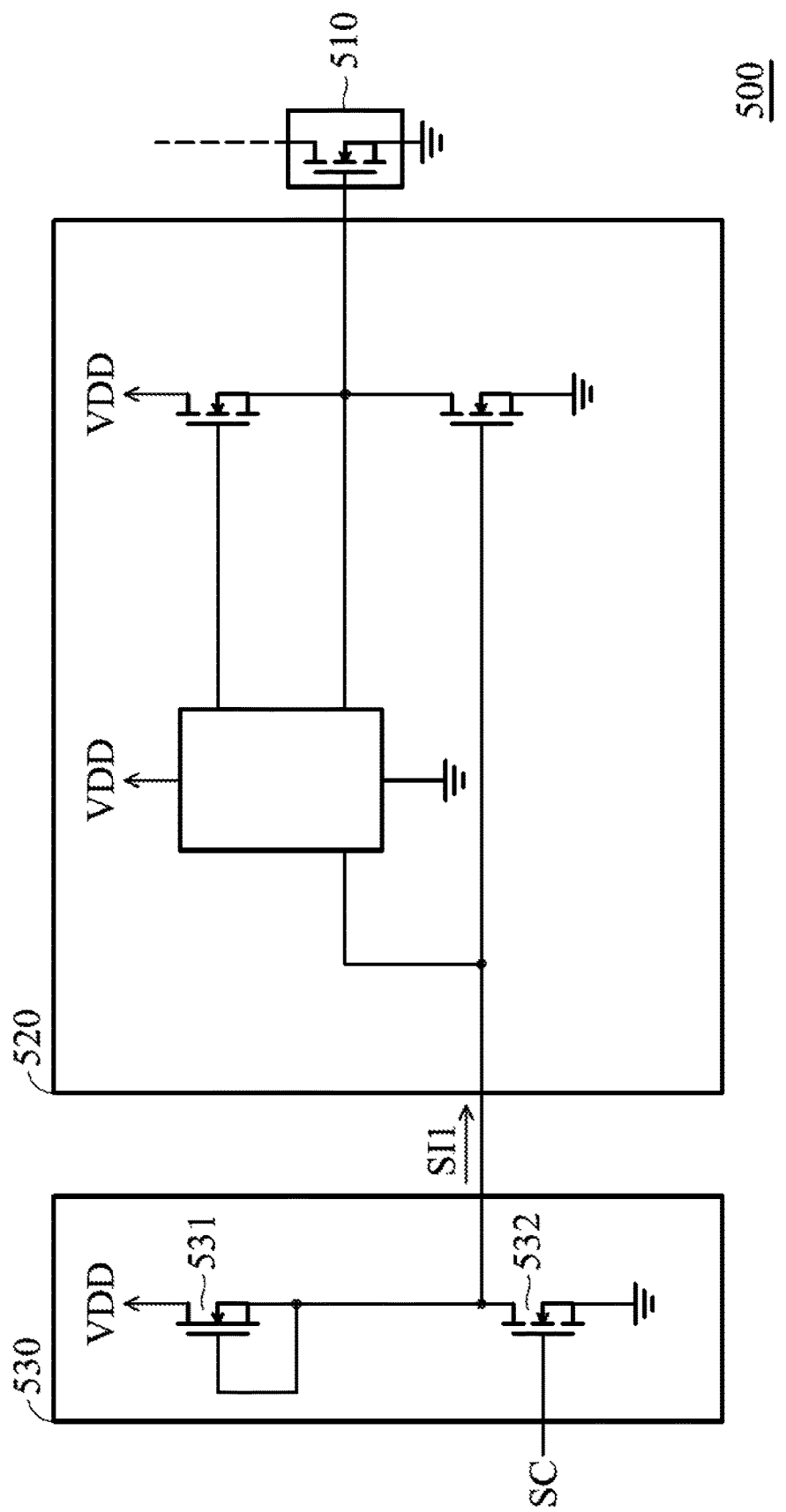
FIG. 5 shows a block diagram of a power circuit in accordance with yet another embodiment of the invention.

FIG. 5 shows a block diagram of a power circuit in accordance with yet another embodiment of the invention. As shown in FIG. 5, the power circuit 500 includes a power transistor 510, a driving circuit 520, and a first pre-driver 530, in which the power transistor 510 and the driving circuit 520 respectively correspond to the power transistor 210 and the driving circuit 220 in FIG. 2.

The first pre-driver 530 receives the control signal SC to generate the first internal signal SI1 to the driving circuit 520 for improving the driving capability of the control signal SC. The first pre-driver 530 includes a first normally-on transistor 531 and a first normally-off transistor 532.

The gate terminal and the source terminal of the first normally-on transistor 531 are coupled to the driving circuit 520, and the drain terminal of the first normally-on transistor 531 is supplied by the supply voltage VDD. The gate terminal of first normally-off transistor 532 receives the control signal SC, the source terminal of first normally-off transistor 532 is coupled to the ground, and the drain terminal of first normally-off transistor 532 is coupled to the driving circuit 520.

Figure 6:
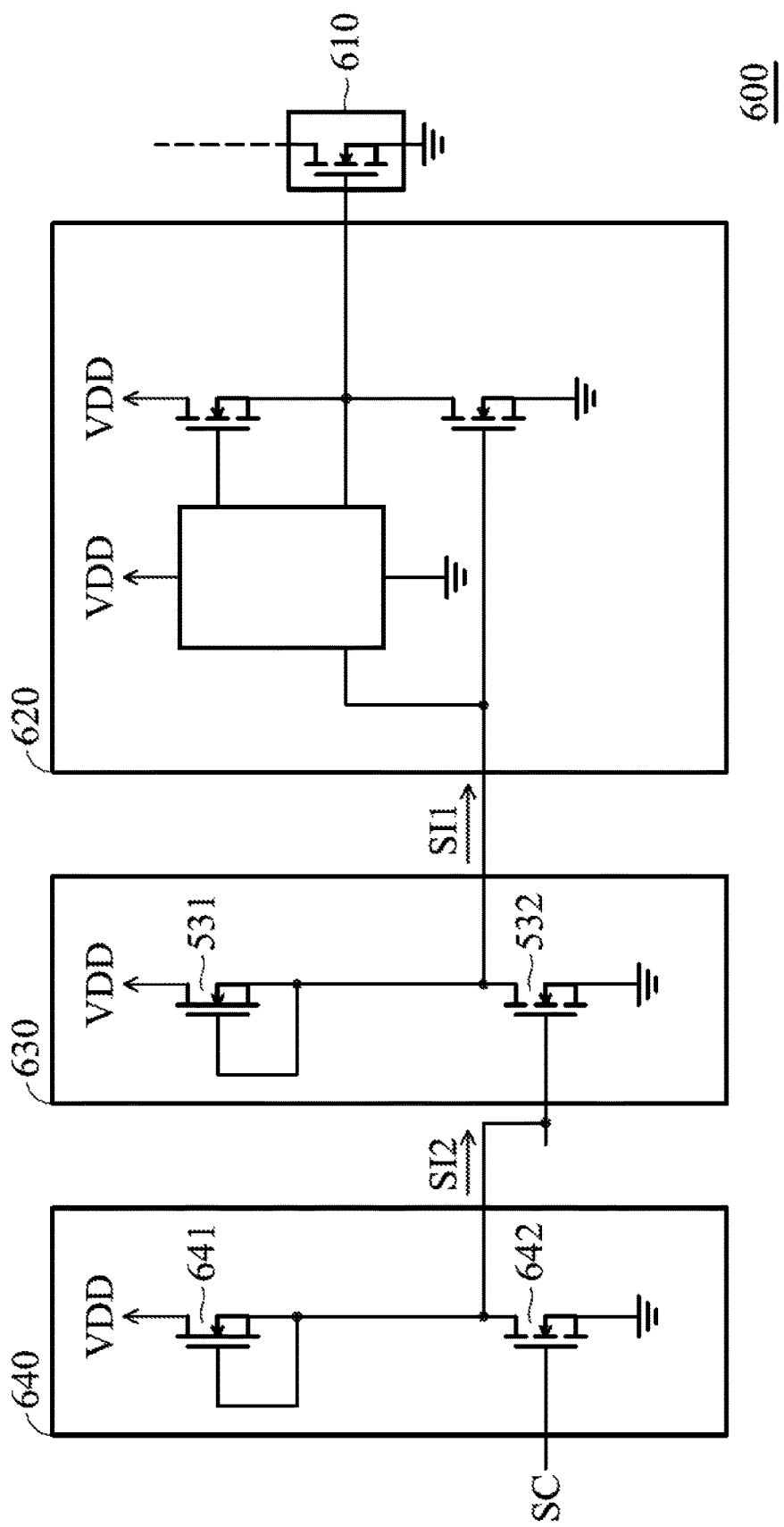
FIG. 6 shows a block diagram of a power circuit in accordance with yet another embodiment of the invention.

FIG. 6 shows a block diagram of a power circuit in accordance with yet another embodiment of the invention. As shown in FIG. 6, the power circuit 600 includes a power transistor 610, a driving circuit 620, a first pre-driver 630, and a second pre-driver 640, in which the power transistor 610, the driving circuit 620, and the first pre-driver 630 respectively correspond to the power transistor 510, the driving circuit 520, and the first pre-driver 530 in FIG. 5.

The second pre-driver 640 receives the control signal SC to generate the second internal signal SI2 to the first pre-driver 630 for further improving the driving capability of the control signal SC. The second pre-driver 640 includes a second normally-on transistor 641 and a second normally-off transistor 642.

The gate terminal and the source terminal of the second normally-on transistor 641 are coupled to the first pre-driver 630, and the drain terminal of the second normally-on transistor 641 is supplied by the supply voltage VDD. The gate terminal of the second normally-off transistor 642 receives the control signal SC, the source terminal of the second normally-off transistor 642 is coupled to the ground, and the drain terminal is coupled to the first pre-driver 630.

Figure 7:
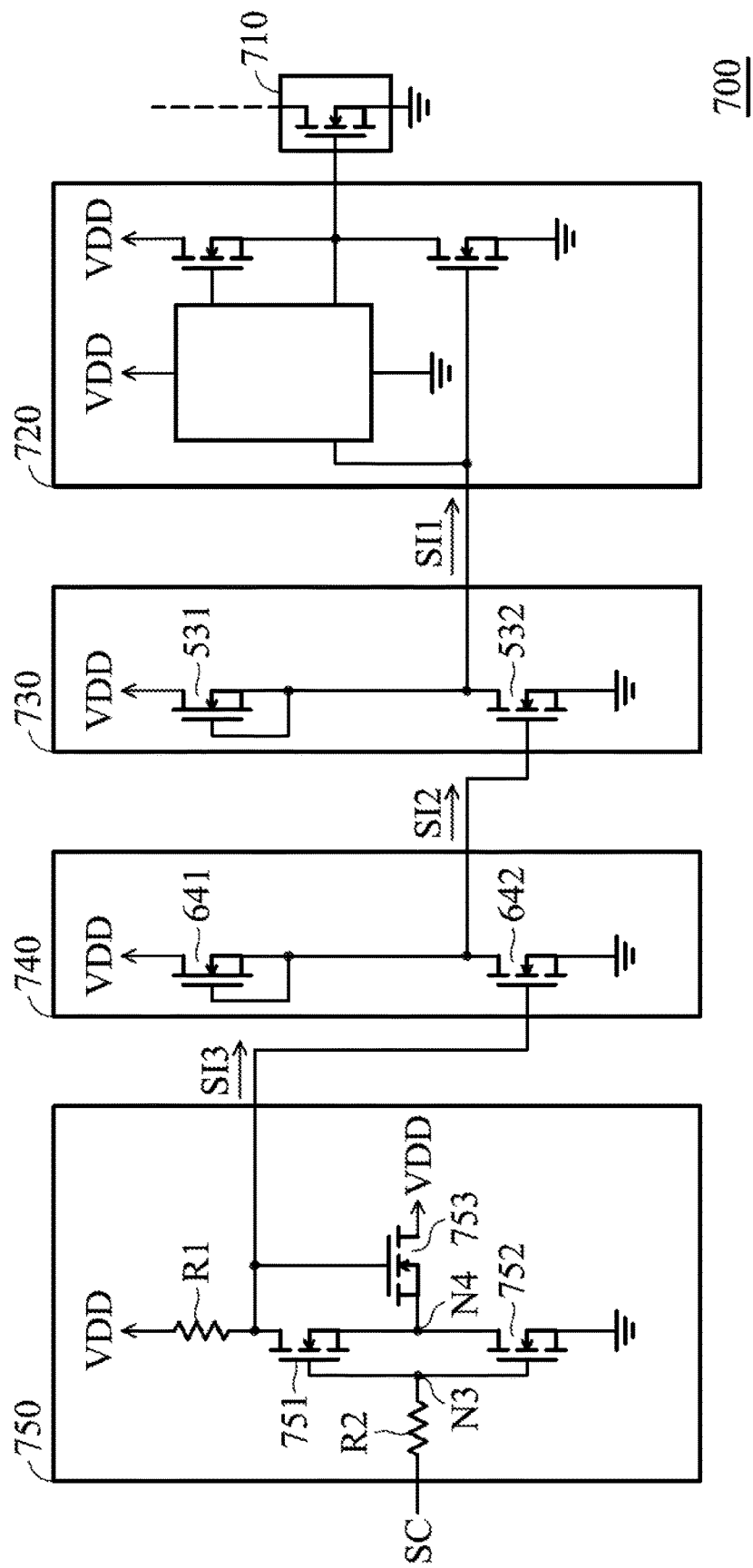
FIG. 7 shows a block diagram of a power circuit in accordance with yet another embodiment of the invention.

FIG. 7 shows a block diagram of a power circuit in accordance with yet another embodiment of the invention. As shown in FIG. 7, the power circuit 700 includes a power transistor 710, a driving circuit 720, a first pre-driver 730, a second pre-driver 740, and a hysteresis circuit 750, in which the power transistor 710, the driving circuit 720, the first pre-driver 730, and the second pre-driver 740 respectively correspond to the power transistor 610, the driving circuit 620, the first pre-driver 630, and the second pre-driver 640 in FIG. 6.

The hysteresis circuit 750 receives the control signal SC to generate the third internal signal SI3 to the second pre-driver 740 for further providing a hysteresis for the control signal SC. The hysteresis circuit 750 includes a first resistor R1, a third normally-off transistor 751, a fourth normally-off transistor 752, a fifth normally-off transistor 753, and a second resistor R2.

The first resistor is coupled to the supply voltage VDD. The gate terminal of the third normally-off transistor 751 is coupled to a third node N3, the source terminal of the third normally-off transistor 751 is coupled to the fourth node N4, and the drain terminal of the third normally-off transistor 751 is coupled to the first resistor R1. The gate terminal of the fourth normally-off transistor 752 is coupled to the third node N3, the source terminal of the fourth normally-off transistor 752 is coupled to the ground, and the drain terminal of the fourth normally-off transistor 752 is coupled to the fourth node N4.

The gate terminal of the fifth normally-off transistor 753 is coupled to the first resistor R1, the source terminal of the fifth normally-off transistor 753 is coupled to the fourth node N4, and the drain terminal of the fifth normally-off transistor 753 is supplied by the supply voltage VDD. The second resistor R2 is coupled to the third node and receives the control signal SC.

Figure 8:
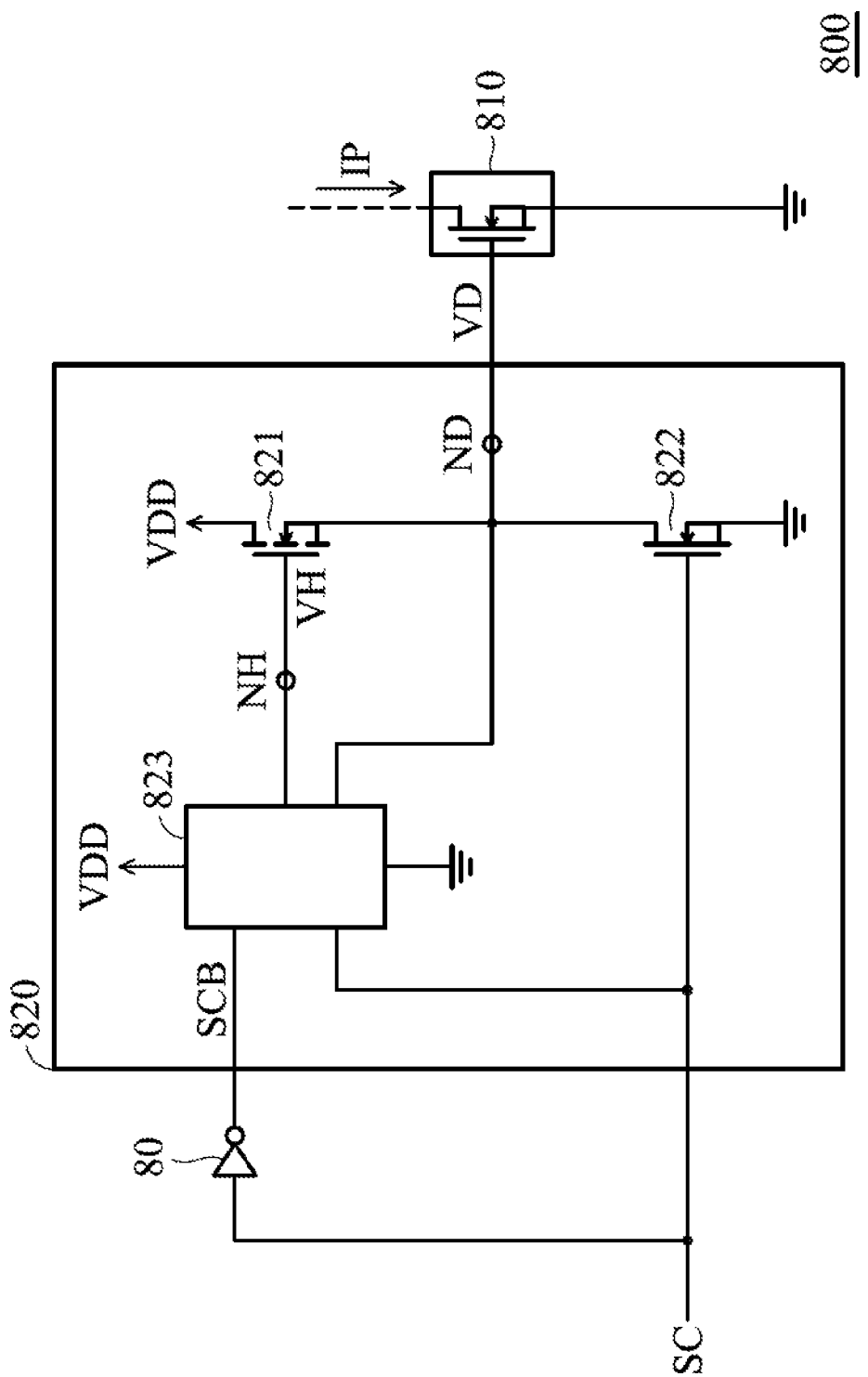
FIG. 8 is a block diagram of a power circuit in accordance with another embodiment of the invention.

FIG. 8 is a block diagram of a power circuit in accordance with another embodiment of the invention. As shown in FIG. 8, the power circuit 800 includes a power transistor 810 and a first bootstrap circuit 820. The power transistor 810 sinks the power current IP to the ground according to the driving voltage VD of the driving node ND. According to an embodiment of the invention, the power transistor 810 is a GaN transistor.

The first bootstrap circuit 820 and the inverter 80 act as a driving circuit for driving the power transistor 810. The first bootstrap circuit 820 includes a high-side transistor 821, a low-side transistor 822, and a charge pump 823. The high-side transistor 821 supplies the supply voltage VDD to the driving node ND according to the high-side voltage VH of the high-side node NH. The low-side transistor 822 is coupled between the driving node ND and the ground, and is configured to pull the driving voltage VD down to the ground according to the control signal SC. According to an embodiment of the invention, the high-side transistor 821 and the low-side transistor 822 are normally-off transistors.

The charge pump 823 is supplied by the supply voltage VDD and the ground and is coupled to the high-side node NH and the driving node ND. To fully turn on the high-side transistor 821, the charge pump 823 is configured to generate a high-side voltage VH that exceeds the supply voltage VDD according to the control signal SC and the reverse control signal SCB generated by the inverter 80, such that the gate-to-source voltage of the high-side transistor 821 at least exceeds the threshold voltage to apply the supply voltage VDD to the driving node ND. According to an embodiment of the invention, the first bootstrap circuit 820 is a rail-to-rail driver, such that the driving voltage VD ranges from the supply voltage VDD to the ground level.

Figure 9:
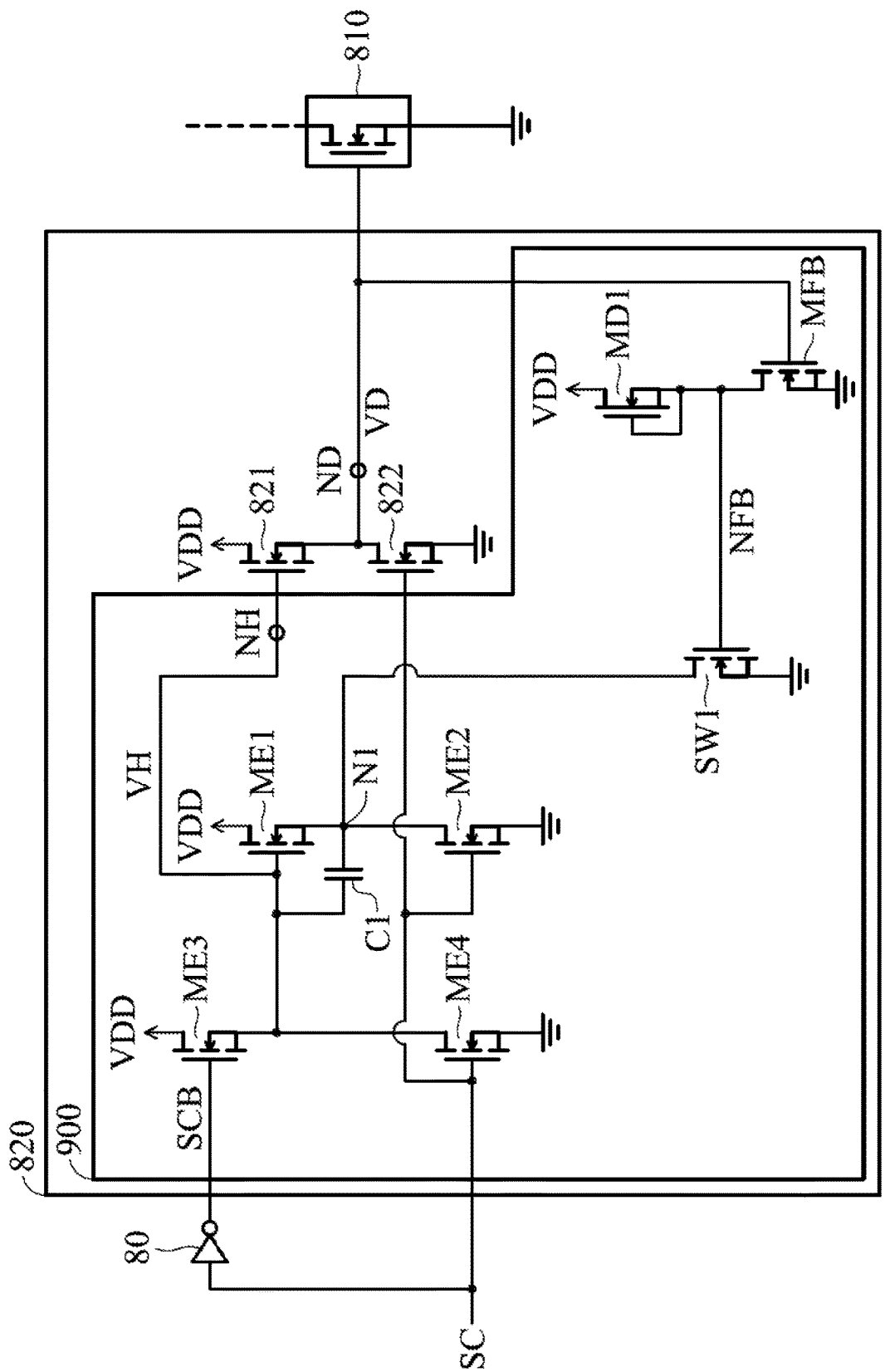
FIG. 9 shows a schematic diagram of the charge pump 823 in FIG. 8 in accordance with the invention.

FIG. 9 shows a schematic diagram of the charge pump 823 in FIG. 8 in accordance with the invention. As shown in FIG. 9, the charge pump 900, which is coupled to the driving node ND and the high-side node NH and receives the control signal SC and the reverse control signal SCB, includes a first normally-on transistor MD1, a feedback normally-off transistor MFB, a first switch SW1, a first normally-off transistor ME1, a second normally-off transistor ME2, a first capacitor C1, a third normally-off transistor ME3, and a fourth normally-off transistor ME4.

The source terminal and the gate terminal of the first normally-on transistor MD1 are coupled to a feedback node NFB and the drain terminal of the first normally-on transistor MD1 is supplied by the supply voltage VDD. The source terminal of the feedback normally-off transistor MFB is coupled to the ground, the gate terminal of the feedback normally-off transistor MFB is coupled to the driving node ND, and the drain terminal of the feedback normally-off transistor MFB is coupled to the feedback node NFB.

The first switch SW1 is configured to electrically connect the first node N1 to the ground according to a voltage of the feedback node NFB. The source terminal of the first normally-off transistor ME1 is coupled to the first node N1, the gate terminal of the first normally-off transistor ME1 is coupled to the high-side node NH, and the drain terminal of the first normally-off transistor ME1 is supplied by the supply voltage VDD.

The source terminal of the second normally-off transistor ME2 is coupled to the ground, the gate terminal of the second normally-off transistor ME2 receives the control signal SC, and the drain terminal of the second normally-off transistor ME2 is coupled to the first node N1.

The first capacitor C1 is coupled between the first node N1 and the high-side node NH. The source terminal of the third normally-off transistor ME3 is coupled to the high-side node NH, the gate terminal of the third normally-off transistor ME3 receives the reverse control signal SCB, and the drain terminal of the third normally-off transistor ME3 is supplied by the supply voltage VDD.

The source terminal of the fourth normally-off transistor ME4 is coupled to the ground, the gate terminal of the fourth normally-off transistor ME4 receives the control signal SC, and the drain terminal of the fourth normally-off transistor ME4 is coupled to the high-side node NH.

According to an embodiment of the invention, when the control signal SC is at the low voltage level, the reverse control signal SCB is at the high voltage level, and the driving voltage VD is still at the low voltage level, the voltage of the feedback node NFB is raised by the first normally-on transistor MD1 to turn ON the first switch SW1, so that the first capacitor C1 is charged by the supply voltage VDD through the third normally-off transistor ME3 and the first switch SW1.

With the high-side voltage VH ramping up, the first normally-off transistor ME1 is gradually turned ON so that the first node N1 ramps up accordingly to boost the high-side voltage VH through the first capacitor C1 for fully turning ON the high-side transistor 821 and the first normally-off transistor ME1, such that the voltage of the first node N1 and the driving voltage VD eventually reach the supply voltage VDD.

When the driving voltage VD is high enough to turn ON the feedback normally-off transistor MFB, the first switch SW1 is turned OFF, such that the voltage of the first node N1 is raised to the supply voltage VDD by the first normally-off transistor ME1. Accordingly, the high-side voltage VH, which is equal to the sum of the voltage of the first node N1 and the voltage across the first capacitor C1, is boosted to a voltage that is higher than the supply voltage VDD after the first switch SW1 is turned OFF.

According to an embodiment of the invention, since the first capacitor C1 is not charged through the low-side transistor 822, the parasitic effects may not interfere with the high-side voltage VH.

Figure 10:
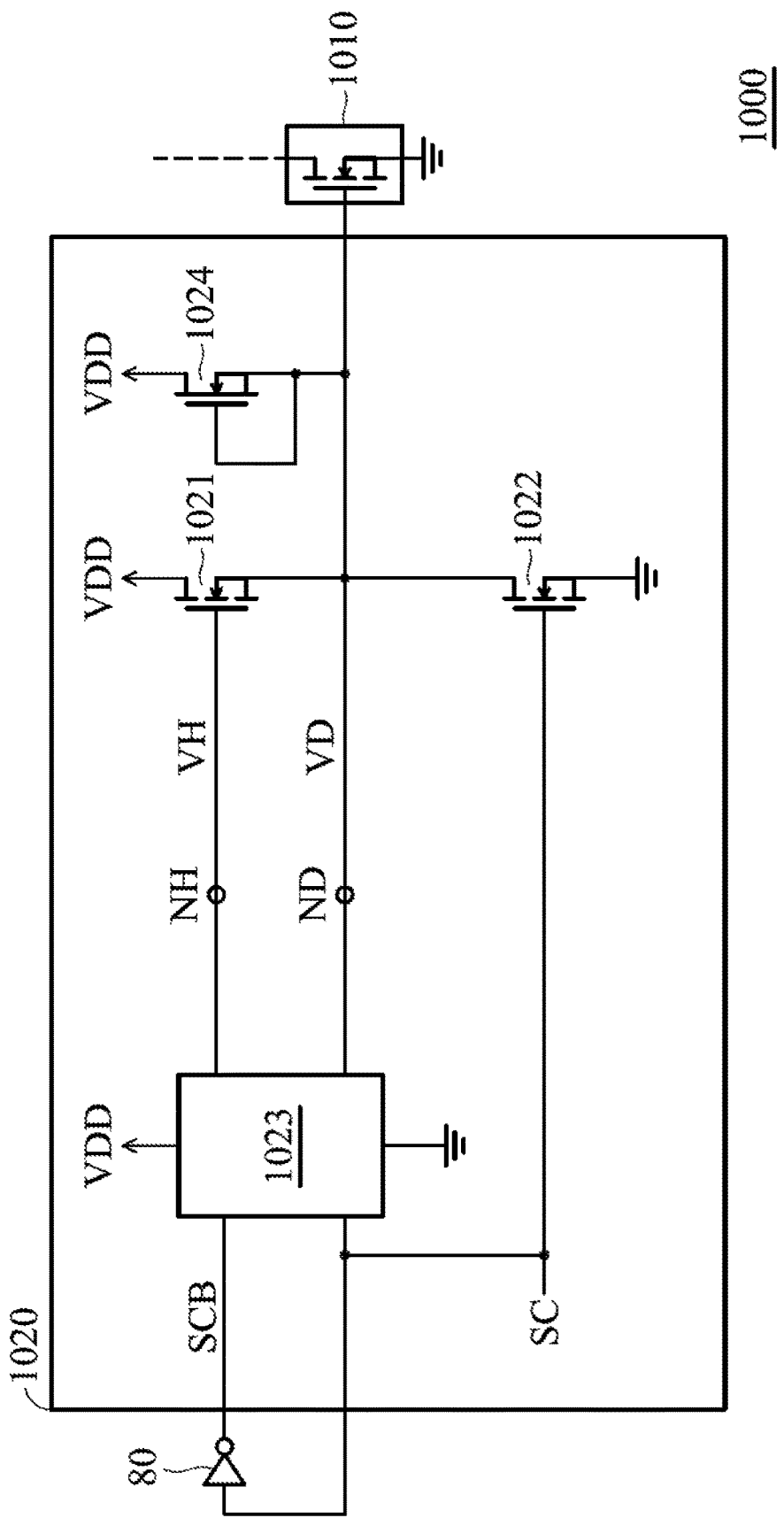
FIG. 10 shows a block diagram of a power circuit in accordance with another embodiment of the invention.

FIG. 10 shows a block diagram of a power circuit in accordance with another embodiment of the invention. As shown in FIG. 10, the power circuit 1000 includes a power transistor 1010 and a first bootstrap circuit 1020, in which the power transistor 1010 and the first bootstrap circuit 1020 respectively correspond to the power transistor 810 and the first bootstrap circuit 820 in FIG. 8.

The first bootstrap circuit 1020 and the inverter 80 act as a driving circuit for driving the power transistor 1010. The first bootstrap circuit 1020 includes a high-side transistor 1021, a low-side transistor 1022, and a charge pump 1023 which respectively correspond to the high-side transistor 821, the low-side transistor 822, and the charge pump 823 in FIG. 8, and further includes a high-side normally-on transistor 1024. The source terminal and the gate terminal of the high-side normally-on transistor 1024 are coupled to the driving node ND, and the drain terminal of the high-side normally-on transistor 1024 is supplied by the supply voltage VDD. The high-side normally-on transistor 1024 is always turned ON to improve the driving capability of the high-side transistor 1021.

Figure 11:
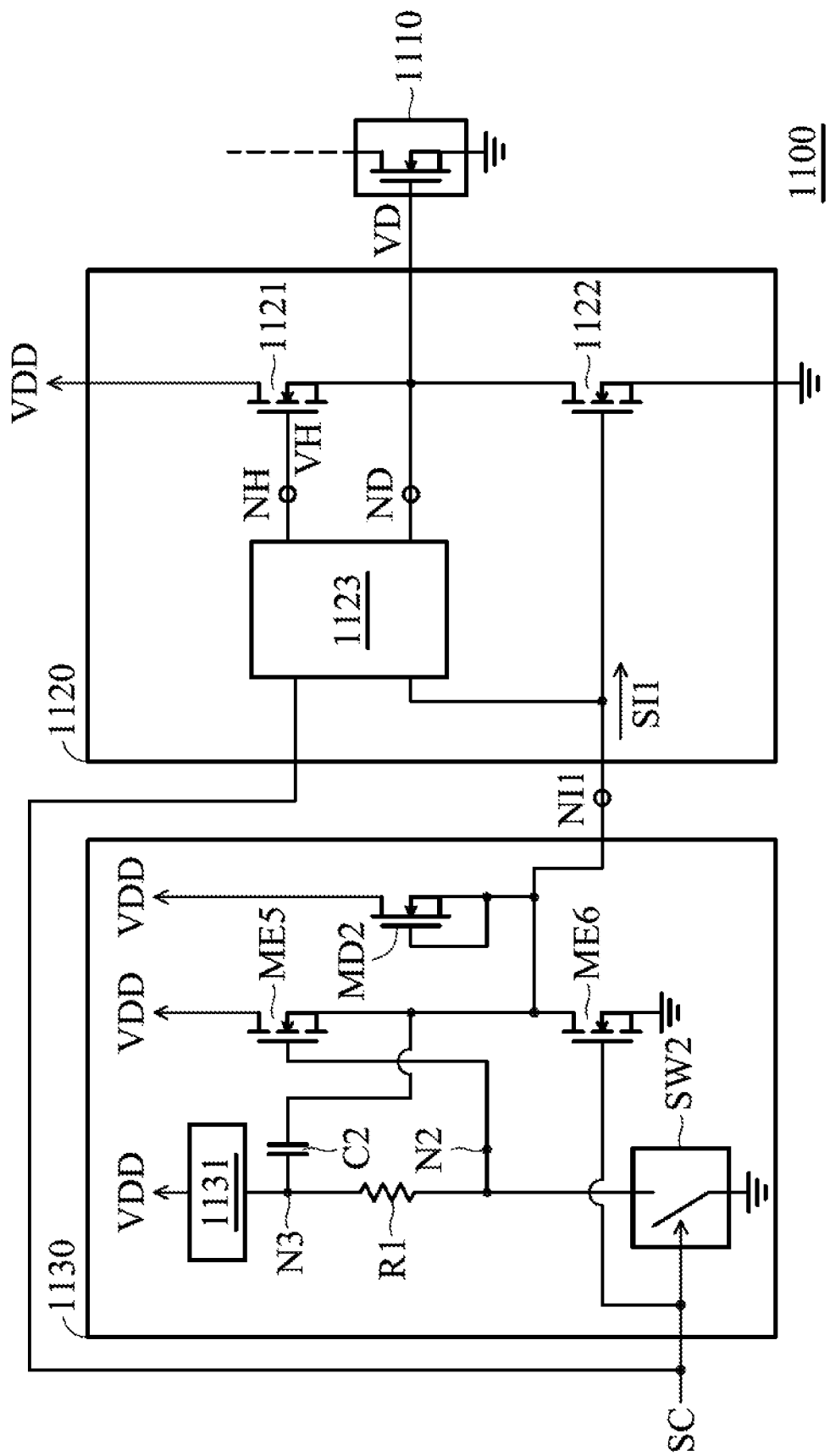
FIG. 11 shows a block diagram of a power circuit in accordance with yet another embodiment of the invention.

FIG. 11 shows a block diagram of a power circuit in accordance with yet another embodiment of the invention. As shown in FIG. 11, the power circuit 1100 includes a power transistor 1110, a first bootstrap circuit 1120, and a second bootstrap circuit 1130, in which the power transistor 1110 corresponds to the power transistor 810 in FIG. 8.

The first bootstrap circuit 1120 and the second bootstrap circuit 1130 act as a driving circuit for driving the power transistor 1110. The first bootstrap circuit 1120 includes a high-side transistor 1121, a low-side transistor 1122, and a charge pump 1123, in which the charge pump 1123 receives the control signal SC and the first internal signal SI1 since the first internal signal SI1 acts as an inverse of the control signal SC.

The second bootstrap circuit 1130 includes a fifth normally-off transistor ME5, a sixth normally-off transistor ME6, a second capacitor C2, a first unidirectional conducting device 1131, a first resistor R1, and a second switch SW2.

The source terminal of the fifth normally-off transistor ME5 is coupled to the first internal node NI1, the gate terminal of the fifth normally-off transistor ME5 is coupled to a second node N2, and the drain terminal of the fifth normally-off transistor ME5 is supplied by the supply voltage VDD. The source terminal of the sixth normally-off transistor ME6 is coupled to the ground, the gate terminal of the sixth normally-off transistor ME6 receives the control signal SC, and the drain terminal is coupled to the first internal node NI1.

The second capacitor C2 is coupled between the third node N3 and the first internal node NI1. The first unidirectional conducting device 1131 unidirectionally provides the supply voltage VDD to the third node N3. According to an embodiment of the invention, the first unidirectional conducting device 1131 is a diode. According to another embodiment of the invention, the first unidirectional conducting device 1131 is a diode-connected normally-off transistor.

The first resistor R1 is coupled between the second node N2 and the third node N3. The second switch SW2 is configured to electrically connect the second node N2 to the ground according to the control signal SC. For the simplicity of illustration, the second switch SW2 is illustrated herein as an N-type transistor. According to an embodiment of the invention, when the control signal SC is at the high voltage level, the sixth normally-off transistor ME6 and the second switch SW2 are turned ON, such that the first internal node NI1 and the second node N2 are both coupled to the ground.

According to an embodiment of the invention, when the control signal SC is at the high voltage level, the second capacitor C2 is charged by the supply voltage VDD through the first unidirectional conducting device 1131 and the sixth normally-off transistor ME6, and the supply voltage VDD is applied to the gate terminal of the fifth normally-off transistor ME5 through the first unidirectional conducting device 1131 and the first resistor R1.

When the fifth normally-off transistor ME5 is gradually turned ON, the first internal signal SI1 is pulled high such that the voltage of the third node N3 (i.e., the gate terminal of the fifth normally-off transistor ME5) is boosted to a voltage equal to the sum of the voltage across the second capacitor C2 and the first internal signal SI1. The voltage of the third node N3 is then provided for the second node N2 (i.e., the gate terminal of the fifth normally-off transistor ME5) through the first resistor R1, resulting in fully turning ON the fifth normally-off transistor ME5 and making the first internal signal SI1 equal to the supply voltage VDD.

According to an embodiment of the invention, the second bootstrap circuit 530 may further include a second normally-on transistor MD2, which is always turned ON, for improving the driving capability of the fifth normally-off transistor ME5. The source terminal and the gate terminal of the second normally-on transistor MD2 are coupled to the first internal node NI1, and the drain terminal of the second normally-on transistor MD2 is supplied by the supply voltage VDD.

According to an embodiment of the invention, since the first internal signal SI1 generated by the second bootstrap circuit 1130 is an inverse of the control signal SC, the function of inverter 80 in FIGS. 8 and 10, which is configured to generate an inverse of the control signal SC, may be taken over by the second bootstrap circuit 1130.

Figure 12:
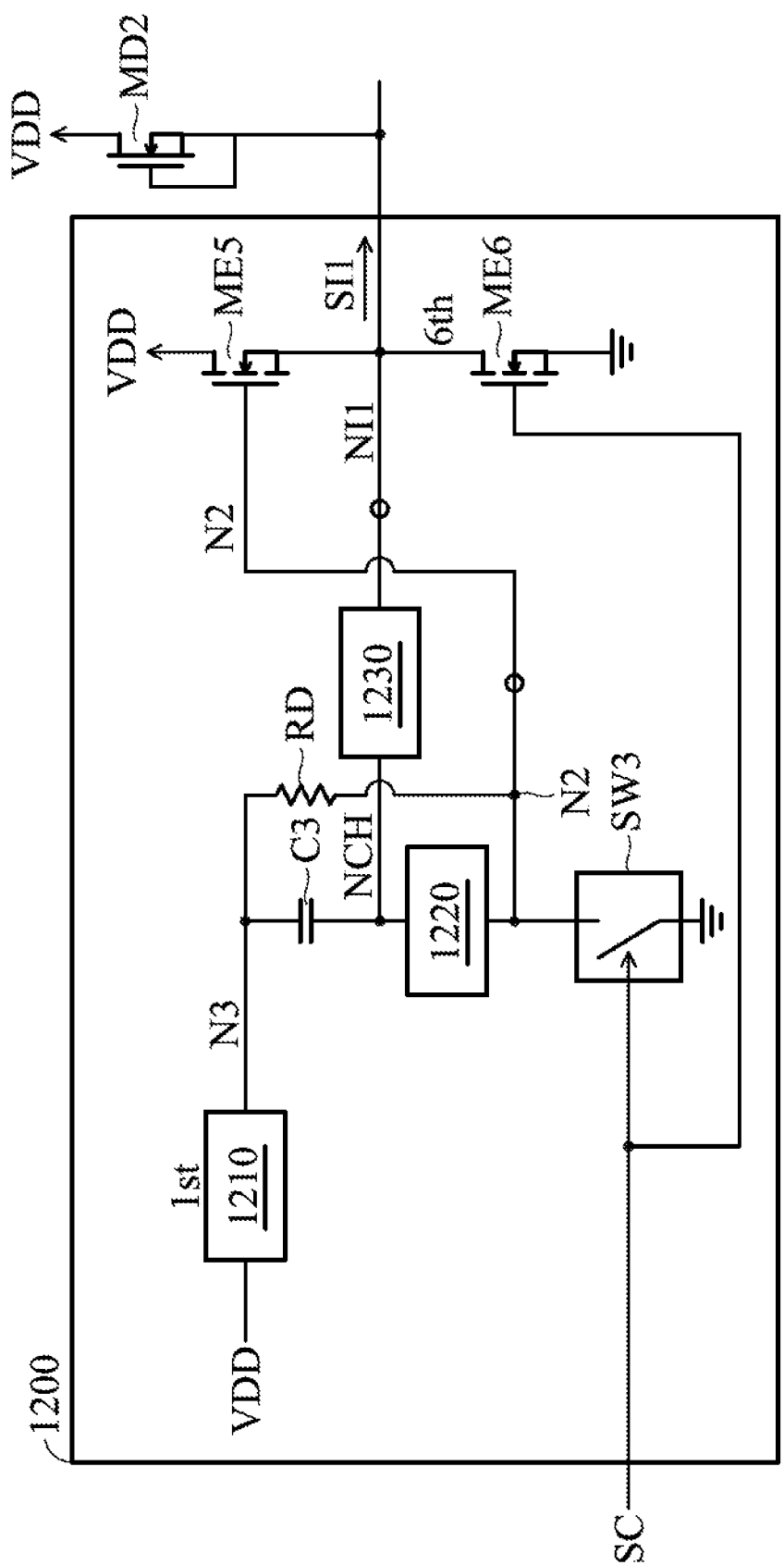
FIG. 12 shows a schematic diagram of a power circuit in accordance with another embodiment of the invention.

FIG. 12 shows a schematic diagram of a power circuit in accordance with another embodiment of the invention. According to an embodiment of the invention, the second bootstrap circuit 1130 in FIG. 11 may be replaced with the bootstrap circuit 1200 in FIG. 12. As shown in FIG. 12, the bootstrap circuit 1200 includes a fifth normally-off transistor ME5, a sixth normally-off transistor ME6, a second unidirectional conducting device 1210, a third unidirectional conducting device 1220, a fourth unidirectional conducting device 1230, a third capacitor C3, a discharge resistor RD, and a third switch SW3.

The fifth normally-off transistor ME5 and the sixth normally-off transistor ME6 are the same as the fifth normally-off transistor ME5 and the sixth normally-off transistor ME6 in FIG. 11. The second unidirectional conducting device 1210 unidirectionally provides the supply voltage VDD to a third node N3. When the supply voltage VDD exceeds the voltage of the third node N3, the second unidirectional conducting device 1210 is turned ON. When the supply voltage VDD does not exceed the voltage of the third node N3, the second unidirectional conducting device 1210 is turned OFF.

The third capacitor C3 is coupled between the third node N3 and a charge node NCH. The discharge resistor RD is coupled between the second node N2 and the third node N3. The third unidirectional conducting device 1220 is coupled between the charge node NCH and the second node N2. When the voltage of the charge node NCH exceeds the voltage of the second node N2, the third unidirectional conducting device 1220 unidirectionally electrically connects the charge node NCH to the second node N2.

The fourth unidirectional conducting device 1230 is coupled between the first internal node NI1 and the charge node NCH. When the first internal signal SI1 exceeds the voltage of the charge node NCH, the fourth unidirectional conducting device 1230 is turned ON. When the first internal signal SI1 does not exceed the voltage of the charge node NCH, the fourth unidirectional conducting device 1230 is turned OFF.

The third switch SW3 receives the control signal SC and is coupled between the second node N2 and the ground. In addition, the third switch SW3 is configured to couple the second node N2 to the ground according to the control signal SC.

For the simplicity of illustration, the third switch SW3 is illustrated herein as an N-type transistor. According to an embodiment of the invention, when the control signal SC is at the high voltage level, such as the supply voltage VDD, the third switch SW3 is turned ON and the third capacitor C3 is charged by the supply voltage VDD through the second unidirectional conducting device 1210, the third unidirectional conducting device 1220, and the third switch SW3 to the ground.

According to another embodiment of the invention, when the control signal SC is at the low voltage level, such as the ground level, the third switch SW3 is turned OFF and the fourth unidirectional conducting device 1230 provides the first internal signal SI1 to the charge node NCH, such that the third capacitor C3 is discharged to the second node N2 (i.e., the gate terminal of the fifth normally-off transistor ME5) through the discharge resistor RD.

According to an embodiment of the invention, the resistance of the discharge resistor RD determines the maximum voltage to which the third capacitor C3 can be charged and also the maximum voltage that the voltage of the second node N2 can reach. In addition, the greater the resistance of the discharge resistor RD, the slower the rising speed that can be achieved by the high-side voltage VD. Therefore, there is a trade-off in the resistance of the discharge resistor RD.

According to an embodiment of the invention, each of the second unidirectional conducting device 1210, the third unidirectional conducting device 1220, and the fourth unidirectional conducting device 1230 is a diode. According to another embodiment of the invention, each of the second unidirectional conducting device 1210, the third unidirectional conducting device 1220, and the fourth unidirectional conducting device 1230 is a diode-connected normally-off transistor.

According to an embodiment of the invention, the bootstrap circuit 1200 may further include a second normally-on transistor MD2, which is always turned ON, for improving the driving capability of the fifth normally-off transistor ME5. The source terminal and the gate terminal of the second normally-on transistor MD2 are coupled to the first internal node NI1, and the drain terminal of the second normally-on transistor MD2 is supplied by the supply voltage VDD.

Figure 13:
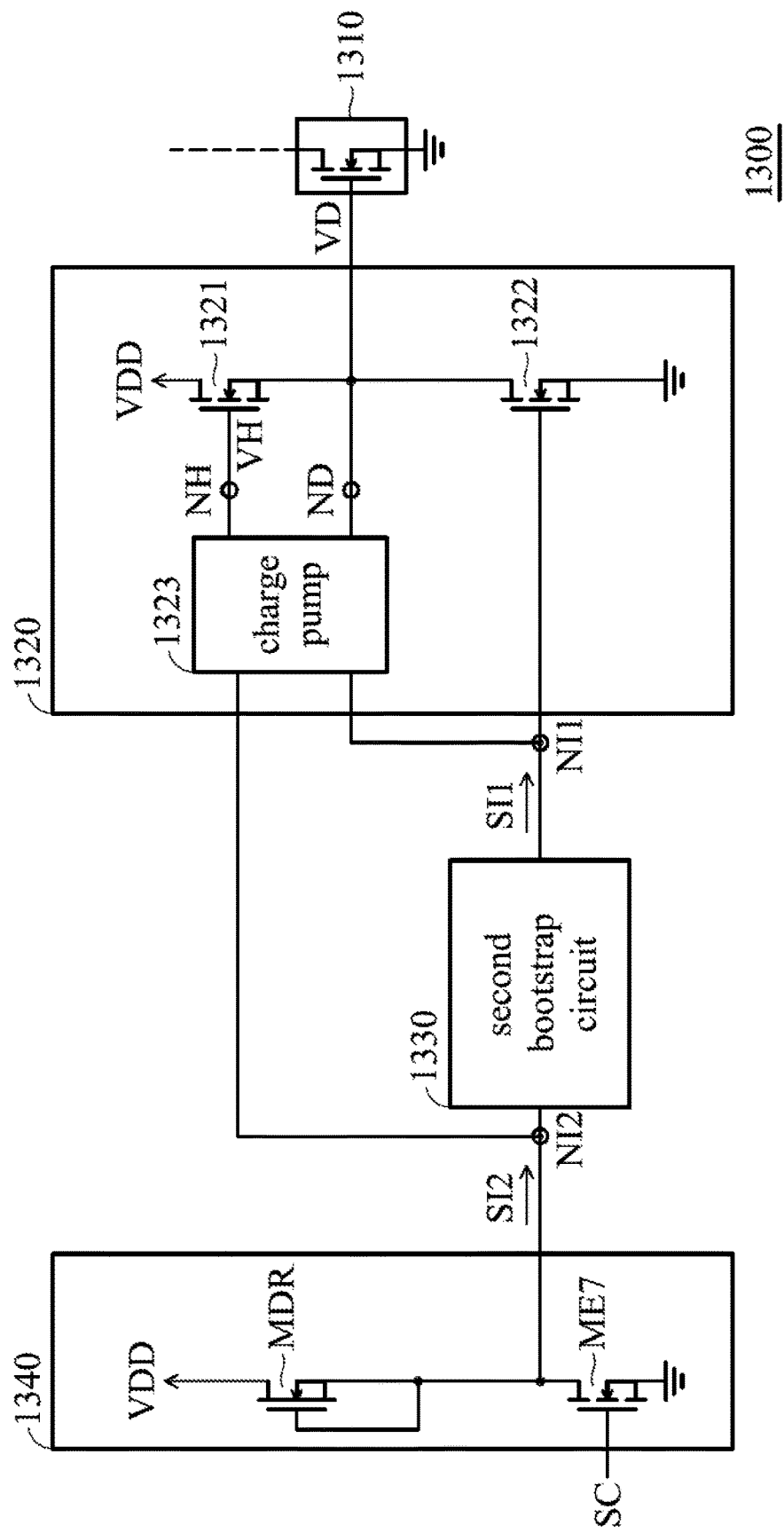
FIG. 13 shows a block diagram of a power circuit in accordance with yet another embodiment of the invention.

FIG. 13 shows a block diagram of a power circuit in accordance with yet another embodiment of the invention. As shown in FIG. 13, the power circuit 1300 includes a power transistor 1310, a first bootstrap circuit 1320, a second bootstrap circuit 1330, and a pre-driver 1340, in which the first bootstrap circuit 1320 includes a high-side transistor 1321, a low-side transistor 1322, and a charge pump 1323. The first bootstrap circuit 1320, the second bootstrap circuit 1330, and the pre-driver 1340 act as a driving circuit for driving the power transistor 1310.

The power transistor 1310, the high-side transistor 1321, the low-side transistor 1322, and the charge pump 1323 respectively correspond to the power transistor 810, the high-side transistor 821, the low-side transistor 822, and the charge pump 823 in FIG. 8. The second bootstrap circuit 1330 corresponds to either the second bootstrap circuit 1130 in FIG. 11 or the second bootstrap circuit 1200 in FIG. 12. According to an embodiment of the invention, the high-side normally-on transistor 1024 in FIG. 10 may also be employed for improving the driving capability of the high-side transistor 1321.

The first bootstrap circuit 1320, the second bootstrap circuit 1330, and the pre-driver 1340 act as a driving circuit for driving the power transistor 1310. The pre-driver 1340 receives the control signal SC to generate the second internal signal S12 to the second bootstrap 1330 for improving the driving capability of the control signal SC. The pre-driver 1340 includes a driving normally-on transistor MDR and a seventh normally-off transistor ME7.

The gate terminal and the source terminal of the driving normally-on transistor MDR are coupled to the second internal node N12, and the drain terminal of the driving normally-on transistor MDR is supplied by the supply voltage VDD. The gate terminal of the seventh normally-off transistor ME7 receives the control signal SC, the source terminal of the seventh normally-off transistor ME7 is coupled to the ground, and the drain terminal of the seventh normally-off transistor ME7 is coupled to the second internal node N12.

Figure 14:
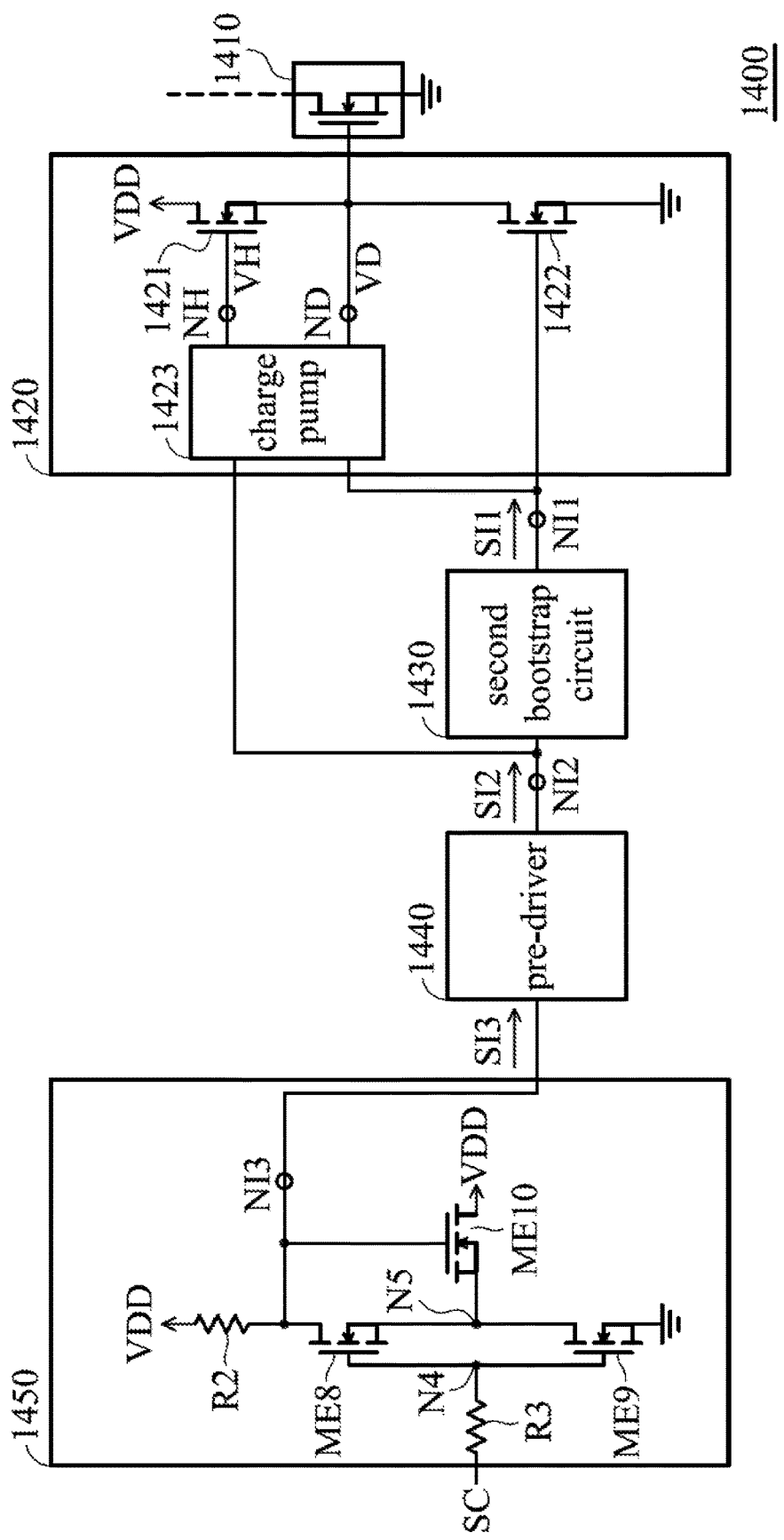
FIG. 14 shows a block diagram of a power circuit in accordance with yet another embodiment of the invention.

FIG. 14 shows a block diagram of a power circuit in accordance with yet another embodiment of the invention. As shown in FIG. 13, the power circuit 1400 includes a power transistor 1410, a first bootstrap circuit 1420, a second bootstrap 1430, a pre-driver 1440, and a hysteresis circuit 1450, in which the first bootstrap circuit 1420 includes a high-side transistor 1421, a low-side transistor 1422, and a charge pump 1423. The first bootstrap circuit 1420, the second bootstrap circuit 1430, the pre-driver 1440, and the hysteresis circuit 1450 act as a driving circuit for driving the power transistor 1410.

The power transistor 1410, the high-side transistor 1421, the low-side transistor 1422, the charge pump 1423, the second bootstrap 1430, and the pre-driver 1440 respectively correspond to the power transistor 1310, the high-side transistor 1321, the low-side transistor 1322, the charge pump 1323, the second bootstrap 1330, and the pre-driver 1340 in FIG. 13. The second bootstrap circuit 1430 corresponds to either the second bootstrap circuit 1130 in FIG. 11 or the second bootstrap circuit 1200 in FIG. 12. According to an embodiment of the invention, the high-side normally-on transistor 1024 in FIG. 10 may also be employed for improving the driving capability of the high-side transistor 1421.

The hysteresis circuit 1450 receives the control signal SC to generate the third internal signal S13 at the third internal node N13 to the pre-driver 1440 for further providing a hysteresis for the control signal SC. The hysteresis circuit 1450 includes a second resistor R2, an eighth normally-off transistor ME8, a ninth normally-off transistor ME9, a tenth normally-off transistor ME10, and a third resistor R3.

The second resistor R2 is coupled between the supply voltage VDD and the third internal node N13. The gate terminal of the eighth normally-off transistor ME8 is coupled to a fourth node N4, the source terminal of the eighth normally-off transistor ME8 is coupled to the fifth node N5, and the drain terminal of the eighth normally-off transistor ME8 is coupled to the second resistor R2 at the third internal node N13. The gate terminal of the ninth normally-off transistor ME9 is coupled to the fourth node N4, the source terminal of the ninth normally-off transistor ME9 is coupled to the ground, and the drain terminal of the ninth normally-off transistor ME9 is coupled to the fifth node N5.

The gate terminal of the tenth normally-off transistor ME10 is coupled to the third internal node N13, the source terminal of the tenth normally-off transistor ME10 is coupled to the fifth node N5, and the drain terminal of the tenth normally-off transistor ME10 is supplied by the supply voltage VDD. The third resistor R3 is coupled to the fourth node N4 and receives the control signal SC.

Since the first capacitor C1 of the charge pump 300 is not charged through the power transistor 810 as shown in FIG. 9, the high-side voltage VH can be kept steady and protected from interference. The second bootstrap circuit 1130 in FIG. 11, the second bootstrap circuit 1230 in FIG. 12, the pre-driver 1340 in FIG. 13, and the hysteresis circuit 1450 in FIG. 14 are configured to improve the driving capability of the control signal SC.

Figure 15:
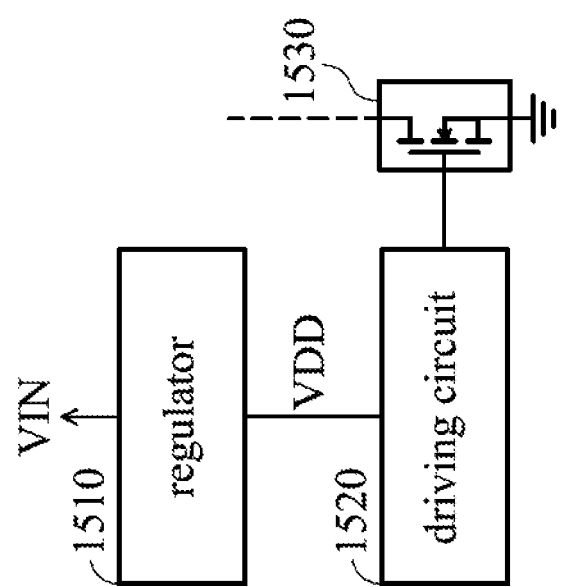
FIG. 15 is a block diagram of an integrated circuit in accordance with an embodiment of the invention.

FIG. 15 is a block diagram of an integrated circuit in accordance with an embodiment of the invention. As shown in FIG. 15, the integrated circuit 1500 includes a regulator 1510, a driving circuit 1520, and a power transistor 1530. The regulator 1510 is configured to convert the input voltage VIN into the supply voltage VDD which is supplied to the driving circuit 1520 for driving the power transistor 1530.

According to some embodiments of the invention, the driving circuit 1520 may be either one of the driving circuit 220 in FIGS. 2 and 3, the driving circuit 420 in FIG. 4, a combination of the driving circuit 520 and the first pre-driver 530 in FIG. 5, a combination of the driving circuit 620, the first pre-driver 630, and the second pre-driver 640 in FIG. 6, a combination of the driving circuit 720, the first pre-driver 730, the second pre-driver 740, and the hysteresis circuit 750 in FIG. 7, a combination of the first bootstrap circuit 820 and the inverter 80 in FIG. 9, a combination of the first bootstrap circuit 1020 and the inverter 80 in FIG. 10, a combination of the first bootstrap circuit 1120 and the second bootstrap circuit 1130 in FIG. 11, a combination of the first bootstrap circuit 1120 in FIG. 11 and the bootstrap circuit 1200 in FIG. 12 and/or the second normally-on transistor MD2, a combination of the first bootstrap circuit 1320, the second bootstrap circuit 1330, and the pre-driver 1340 in FIG. 13, and a combination of the first bootstrap circuit 1420, a second bootstrap 1430, a pre-driver 1440, and a hysteresis circuit 1450 in FIG. 14.

According to some embodiments of the invention, the power transistor 1530 corresponds to either one of the power transistor 210 in FIGS. 2 and 3, the power transistor 410 in FIG. 4, the power transistor 510 in FIG. 5, the power transistor 610 in FIG. 6, the power transistor 710 in FIG. 7, the power transistor 810 in FIGS. 8 and 9, the power transistor 1010 in FIG. 10, the power transistor 1110 in FIG. 11, the power transistor 1310 in FIG. 13, and the power transistor 1410 in FIG. 14.

Figure 16:
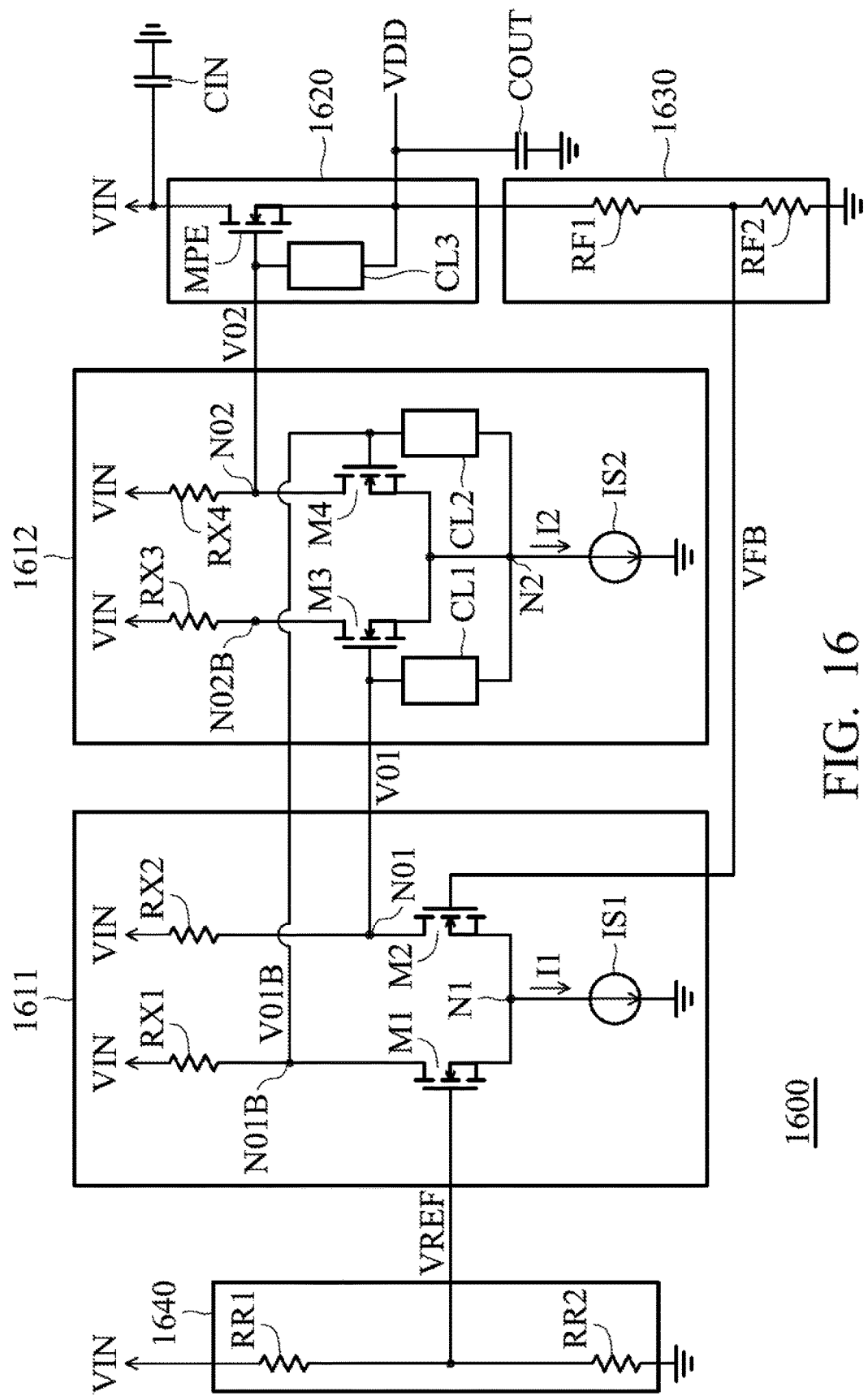
FIG. 16 is a schematic diagram of the regulator 1510 in FIG. 15 in accordance with an embodiment of the invention.

FIG. 16 is a schematic diagram of the regulator 1510 in FIG. 15 in accordance with an embodiment of the invention. As shown in FIG. 16, the regulator 1600 includes a first differential amplifier 1611, a second differential amplifier 1612, a pass element 1620, a feedback voltage divider 1630, a reference voltage divider 1640, an input capacitor CIN, and an output capacitor COUT, in which the first differential amplifier 1611 is cascaded with the second differential amplifier 1612. According to an embodiment of the invention, the regulator 1600 is fully implemented by a GaN process.

The first differential amplifier 1611 compares the reference voltage VREF with the feedback voltage VFB to generate the first output voltage VO1 at the first output node NO1 and the first inverse output voltage VO1B at the first inverse output voltage NO1B. The second differential amplifier 1612 compares the first output voltage VO1 and the first inverse output voltage VO1B to generate a second output voltage VO2.

The pass element 1620 passes an output current IO from the input voltage VIN to the supply voltage VDD according to the second output voltage VO2 at a second output node NO2. The feedback voltage divider 1630 divides the supply voltage VDD by a feedback factor to generate the feedback voltage VFB. The reference voltage divider 1640 divides the input voltage VIN by a reference factor to generate the reference voltage VREF.

As shown in FIG. 16, the first differential amplifier 1611 includes a first N-type transistor M1, a first resistor RX1, a second N-type transistor M2, a second resistor RX2, and a first current source I1. the first N-type transistor M1 includes a gate terminal receiving the reference voltage REF, a source terminal coupled to a first node N1, and a drain terminal coupled to the first inverse output node NO1B. The first resistor RX1 is coupled between the input voltage VIN and the first inverse output node NO1B.

The second N-type transistor M2 includes a gate terminal receiving the feedback voltage VFB, a source terminal coupled to the first node N1, and a drain terminal coupled to the first output node NO1. The second resistor RX2 is coupled between the input voltage VIN and the first output node NO1. The first current source I1 sinks a first current I1 from the first node N1 to a ground.

The second differential amplifier 1612 includes a third N-type transistor M3, a third resistor RX3, a fourth N-type transistor M4, a fourth resistor RX4, a second current source IS2, a first clamp circuit CL1, and a second clamp circuit CL2. The third N-type transistor M3 includes a gate terminal receiving the first output voltage VO1, a source terminal coupled to a second node N2, and a drain terminal coupled to a second inverse output node NO2B. The third resistor RX3 is coupled between the input voltage VIN and the second inverse output node NO2B.

The fourth N-type transistor M4 includes a gate terminal receiving the first inverse output voltage VO1B, a source terminal coupled to the second node N2, and a drain terminal coupled to the second output node NO2. The fourth resistor RX4 is coupled between the input voltage VIN and the second output node NO2. The second current source IS2 sinks a second current I2 from the second node N2 to the ground.

The first clamp circuit CL1 is coupled between the first output node NO1 and the second node N2, which is configured to clamp the gate-to-source voltage of the third N-type transistor M3. The second clamp circuit CL2 is coupled between the first inverse output node NO1B and the second node N2, which is configured to clamp the gate-to-source voltage of the fourth N-type transistor M4.

The pass element 1620 includes a pass N-type transistor MPE and a third clamp circuit CL3. The pass N-type transistor MPE includes a gate terminal receiving the second output voltage VO2, a source terminal coupled to the supply voltage VDD, and a drain terminal receiving the input voltage VIN. The third clamp circuit CL3 is coupled between the gate terminal and the source terminal of the pass N-type transistor MPE, which is configured to clamp the gate-to-source voltage of the pass N-type transistor MPE. Each of the first clamp circuit CL1, the second clamp circuit CL2, and the third clamp circuit CL3 will be discussed in detail in the following paragraphs.

The feedback voltage divider 1630 includes a first feedback resistor RF1 and a second feedback resistor RF2. The feedback factor is equal to: $R_{F2}/R_{F1}+R_{F2}$. The reference voltage divider 1640 includes a first reference resistor RR1 and a second reference resistor RR2. The reference factor is equal to: $R_{R2}/R_{R1}+R_{R2}$.

According to an embodiment of the invention, when the supply voltage VDD is too high to make the feedback voltage VFB exceed the reference voltage VREF, the first differential amplifier 1611 generates the first output voltage VO1 lower than the first inverse output voltage VO1B, such that the second differential amplifier 1612 pulls down the second output voltage VO2 to close the pass N-type transistor MPE for pulling down the supply voltage VDD.

According to another embodiment of the invention, when the supply voltage VDD is too low to make the feedback voltage VFB lower than the reference voltage VREF, the first differential amplifier 1611 generates the first output voltage VO1 exceeding the first inverse output voltage VO1B, such that the second differential amplifier 1612 raises the second output voltage VO2 to further turn ON the pass N-type transistor MPE for raising the supply voltage VDD.

According to an embodiment of the invention, since the regulator 1600 is fully implemented in a GaN process which only has N-type transistors, the cascaded first differential amplifier 1611 and second differential amplifier 1612 provide a suitable amplifier topology for the regulator 1600 being implemented in the GaN process.

Figure 17:
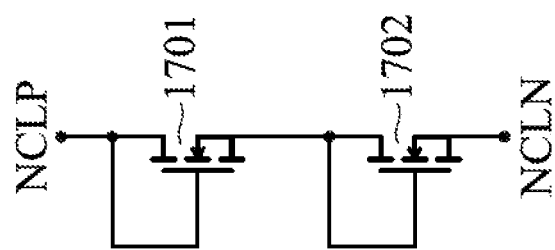
FIG. 17 shows a schematic diagram of a clamp circuit in accordance with an embodiment of the invention.

FIG. 17 shows a schematic diagram of a clamp circuit in accordance with an embodiment of the invention. According to an embodiment of the invention, each of the first clamp circuit CL1, the second clamp circuit CL2, and the third clamp circuit CL3 may be implemented by the clamp circuit 1700.

As shown in FIG. 17, the clamp circuit 1700 includes a first clamp N-type transistor 1701 and a second clamp N-type transistor 1702, in which the first clamp N-type transistor 1701 and the second clamp N-type transistor 1702 are diode-connected and also cascaded between the positive clamp node NCLP and the negative clamp node NCLN. According to an embodiment of the invention, each of the first clamp N-type transistor 1701 and the second clamp N-type transistor 1702 is a GaN transistor.

According to an embodiment of the invention, when the voltage of the positive clamp node NCLP is high enough to turn ON the first clamp N-type transistor 1701 and the second clamp N-type transistor 1702, the voltage difference between the positive clamp node NCLP and the negative clamp node NCLN is then clamped at the sum of the gate-to-source voltage of the first clamp N-type transistor 1701 and the gate-to-source voltage of the second clamp N-type transistor 1702. Therefore, the voltage difference between the positive clamp node NCLP and the negative clamp node NCLN is then maintained within a safety range.

According to an embodiment of the invention, when the first clamp circuit CL1, the second clamp circuit CL2, and the third clamp circuit CL3 are replaced by the clamp circuit 1700, the gate-to-source voltages of the third N-type transistor M3, the fourth N-type transistor M4, and the pass N-type transistor MPE can be kept below the breakdown voltage.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A regulator for converting an input voltage into a supply voltage, comprising:
   a first differential amplifier, comparing a reference voltage with a feedback voltage to generate a first output voltage at a first output node and a first inverse output voltage at a first inverse output node;
   a second differential amplifier, comparing the first output voltage and the first inverse output voltage to generate a second output voltage;
   a pass element, passing an output current from the input voltage to the supply voltage according to the second output voltage at a second output node; and
   a feedback voltage divider, dividing the supply voltage by a feedback factor to generate the feedback voltage.

2. The regulator in claim 1, further comprising:
   a reference voltage divider, dividing the input voltage by a reference factor to generate the reference voltage.

3. The regulator in claim 1, wherein the first differential amplifier comprises:
   a first N-type transistor, comprising a gate terminal receiving the reference voltage, a source terminal coupled to a first node, and a drain terminal coupled to the first inverse output node;
   a first resistor, coupled between the input voltage and the first inverse output node;
   a second N-type transistor, comprising a gate terminal receiving the feedback voltage, a source terminal coupled to the first node, and a drain terminal coupled to the first output node;
   a second resistor, coupled between the input voltage and the first output node; and
   a first current source, sinking a first current from the first node to a ground.

4. The regulator in claim 1, wherein the second differential amplifier comprises:
   a third N-type transistor, comprising a gate terminal receiving the first output voltage, a source terminal coupled to a second node, and a drain terminal coupled to a second inverse output node;
   a third resistor, coupled between the input voltage and the second inverse output node;
   a fourth N-type transistor, comprising a gate terminal receiving the first inverse output voltage, a source terminal coupled to the second node, and a drain terminal coupled to the second output node;
   a fourth resistor, coupled between the input voltage and the second output node; and
   a second current source, sinking a second current from the second node to the ground.

5. The regulator of claim 4, wherein the second differential amplifier further comprises:
   a first clamp circuit, comprising a positive clamp node coupled to the first output node and a negative clamp node coupled to the second node, wherein the first clamp circuit is configured to clamp a voltage between the gate terminal and the source terminal of the third N-type transistor; and
   a second clamp circuit, comprising a positive clamp node coupled to the first inverse output node and a negative clamp node coupled to the second node, wherein the second clamp circuit is configured to clamp a voltage between the gate terminal and the source terminal of the fourth N-type transistor.

6. The regulator of claim 5, wherein the pass element comprises:
   a pass N-type transistor, comprising a gate terminal receiving the second output voltage, a source terminal coupled to the supply voltage, and a drain terminal receiving the input voltage; and
   a third clamp circuit, comprising a positive clamp node coupled to the gate terminal and a negative clamp node coupled to the source terminal of the pass N-type transistor, wherein the third clamp circuit is configured to clamp a voltage between the gate terminal and the source terminal of the pass N-type transistor.

7. The regulator of claim 6, wherein each of the first clamp circuit, the second clamp circuit, and the third clamp circuit comprises:
   a first clamp N-type transistor, comprising a gate terminal coupled to the positive clamp node, a source terminal, and a drain terminal coupled to the positive clamp node; and
   a second clamp N-type transistor, comprising a gate terminal and a drain terminal coupled to the source terminal of the first clamp node and a source terminal coupled to the negative clamp node, wherein each of the first clamp N-type transistor and the second clamp N-type transistor is a GaN transistor.

8. The regulator of claim 1, wherein the regulator is implemented by a GaN process.

9. A circuit, comprising:
   a regulator, converting an input voltage into a supply voltage, wherein the regulator comprises:
      a first differential amplifier, comparing a reference voltage with a feedback voltage to generate a first output voltage at a first output node and a first inverse output voltage at a first inverse output node;

a second differential amplifier, comparing the first output voltage and the first inverse output voltage to generate a second output voltage;

a pass element, passing an output current from the input voltage to the supply voltage according to the second output voltage at a second output node; and a feedback voltage divider, dividing the supply voltage by a feedback factor to generate the feedback voltage; and a power circuit, supplied by the supply voltage, wherein the power circuit comprises:

a power transistor, passing a power current to a ground according to a drive voltage of a drive node; and a driving circuit, generating the driving voltage according to a control signal.

10. The circuit of claim 9, wherein the regulator further comprises:

a reference voltage divider, dividing the input voltage by a reference factor to generate the reference voltage.

11. The circuit of claim 9, wherein the first differential amplifier comprises:

a first N-type transistor, comprising a gate terminal receiving the reference voltage, a source terminal coupled to a first node, and a drain terminal coupled to the first inverse output node;

a first resistor, coupled between the input voltage and the first inverse output node;

a second N-type transistor, comprising a gate terminal receiving the feedback voltage, a source terminal coupled to the first node, and a drain terminal coupled to the first output node;

a second resistor, coupled between the input voltage and the first output node; and a first current source, sinking a first current from the first node to a ground.

12. The circuit of claim 9, wherein the second differential amplifier comprises:

a third N-type transistor, comprising a gate terminal receiving the first output voltage, a source terminal coupled to a second node, and a drain terminal coupled to a second inverse output node;

a third resistor, coupled between the input voltage and the second inverse output node;

a fourth N-type transistor, comprising a gate terminal receiving the first inverse output voltage, a source terminal coupled to the second node, and a drain terminal coupled to the second output node;

a fourth resistor, coupled between the input voltage and the second output node; and a second current source, sinking a second current from the second node to the ground.

13. The circuit of claim 12, wherein the second differential amplifier further comprises:

a first clamp circuit, coupled between the first output node and the second node and configured to clamp a voltage between the gate terminal and the source terminal of the third N-type transistor; and a second clamp circuit, coupled between the first inverse output node and the second node and configured to clamp a voltage between the gate terminal and the source terminal of the fourth N-type transistor.

14. The circuit of claim 13, wherein the pass element comprises:

a pass N-type transistor, comprising a gate terminal receiving the second output voltage, a source terminal coupled to the supply voltage, and a drain terminal receiving the input voltage; and a third clamp circuit, coupled between the gate terminal and the source terminal of the pass N-type transistor and configured to clamp a voltage between the gate terminal and the source terminal of the pass N-type transistor.

15. The regulator of claim 14, wherein each of the first clamp circuit, the second clamp circuit, and the third clamp circuit comprises:

a first clamp N-type transistor, comprising a gate terminal coupled to the positive clamp node, a source terminal, and a drain terminal coupled to the positive clamp node; and a second clamp N-type transistor, comprising a gate terminal and a drain terminal coupled to the source terminal of the first clamp node and a source terminal coupled to the negative clamp node, wherein each of the first clamp N-type transistor and the second clamp N-type transistor is a GaN transistor.

16. The circuit of claim 9, wherein the regulator is fully implemented by a GaN process.

17. The circuit of claim 9, wherein the driving circuit comprises:

a high-side transistor, providing the supply voltage to the drive node according to a high-side voltage of a high-side node;

a low-side transistor, coupling the drive node to the ground according to the control signal; and a charge pump, coupled to the high-side node and the drive node, wherein the charge pump is configured to generate a high-side voltage that exceeds the supply voltage according to the control signal.

18. The circuit of claim 17, wherein the high-side transistor and the low-side transistor are normally-off transistors.

19. The circuit of claim 17, wherein the power transistor is a GaN transistor.

20. The circuit of claim 17, wherein the charge pump comprises:

a first unidirectional conducting device, unidirectionally providing the supply voltage to a first node;

a capacitor, coupled between the first node and a second node;

a discharge resistor, coupled between the first node and the high-side node;

a second unidirectional conducting device, unidirectionally coupling the second node to the high-side node when a voltage of the second node exceeds a voltage of the high-side node;

a third unidirectional conducting device, unidirectionally providing the drive voltage to the second node when the drive voltage exceeds the voltage of the second node; and a switch, receiving the control signal and configured to couple the high-side node to the ground according to the control signal.

21. The circuit of claim 20, wherein, when the control signal is at a high voltage level, the switch is turned ON and the capacitor is charged by the supply voltage through the first unidirectional conducting device, the second unidirectional conducting device, and the switch, wherein, when the control signal is at a low voltage level, the switch is turned OFF, the third unidirectional conducting device provides the drive voltage to the second node, and the capacitor is discharged to the drive node through the discharge resistor.

22. The circuit of claim 20, wherein each of the first unidirectional conducting device, the second unidirectional conducting device, and the third unidirectional conducting device is a diode or a diode-connected normally-off transistor.

23. The circuit of claim 17, wherein the driving circuit further comprises:
a high-side normally-on transistor, comprising a source terminal coupled to the drive node, a gate terminal coupled to the drive node, and a drain terminal supplied by the supply voltage, wherein the high-side normally-on transistor is configured to improve driving capability of the high-side transistor.

24. The circuit of claim 17, wherein the power circuit further comprises:
a first pre-driver, coupled between the control signal and the driving circuit and configured to improve driving capability of the control signal, wherein the first pre-driver comprises:
a first normally-on transistor, comprising a gate terminal coupled to the driving circuit, a source terminal coupled to the driving circuit, and a drain terminal supplied by the supply voltage; and
a first normally-off transistor, comprising a gate terminal receiving the control signal, a source terminal coupled to the ground, and a drain terminal coupled to the driving circuit.

25. The circuit of claim 24, wherein the driving circuit further comprises:
a second pre-driver, coupled between the control signal and the first pre-driver, wherein the second pre-driver comprises:
a second normally-on transistor, comprising a gate terminal coupled to the gate terminal of the first normally-off transistor, a source terminal coupled to the gate terminal of the first normally-off transistor, and a drain terminal supplied by the supply voltage; and
a second normally-off transistor, comprising a gate terminal receiving the control signal, a source terminal coupled to the ground, and a drain terminal coupled to the gate terminal of the first normally-off transistor.

26. The circuit of claim 25, wherein the driving circuit further comprises:
a hysteresis circuit, coupled between the control signal and the second pre-driver, wherein the hysteresis circuit comprises:
a first resistor, coupled to the supply voltage;
a third normally-off transistor, comprising a gate terminal coupled to a third node, a source terminal coupled to a fourth node, and a drain terminal coupled to the first resistor;
a fourth normally-off transistor, comprising a gate terminal coupled to the third node, a source terminal coupled to the ground, and a drain terminal coupled to the fourth node;
a fifth normally-off transistor, comprising a gate terminal coupled to the first resistor, a source terminal coupled to the fourth node, and a drain terminal supplied by the supply voltage; and
a second resistor, coupled to the third node and receiving the control signal.

27. The circuit of claim 9, wherein the driving circuit comprises:
a first bootstrap circuit, comprising:
a high-side transistor, providing a supply voltage to the driving node according to a high-side voltage of a high-side node;
a low-side transistor, electrically connecting the driving node to the ground according to a first internal signal; and
a charge pump, coupled to the high-side node and the driving node, wherein the charge pump is configured to generate the high-side voltage that exceeds the supply voltage according to the first internal signal and a second internal signal;
a second bootstrap circuit, receiving the second internal signal to generate the first internal signal at a first internal node;
a pre-driver, receiving a third internal signal to generate the second internal signal at a second internal node, wherein the second bootstrap circuit and the pre-driver are configured to improve driving capability of the control signal; and
a hysteresis circuit, receiving a control signal to generate the third internal signal at a third internal node and configured to provide a hysteresis for the control signal.

28. The circuit of claim 27, wherein the high-side transistor and the low-side transistor are normally-off transistors.

29. The circuit of claim 27, wherein the power transistor is a GaN transistor.

30. The circuit of claim 27, wherein the charge pump comprises:
a first normally-on transistor, comprising a source terminal, a gate terminal, and a drain terminal, wherein the source terminal and the gate terminal are coupled to a feedback node, and the drain terminal is supplied by the supply voltage;
a feedback normally-off transistor, comprising a source terminal, a gate terminal, and a drain terminal, wherein the source terminal is coupled to the ground, the gate terminal is coupled to the driving node, and the drain terminal is coupled to the feedback node;
a first switch, configured to electrically connect a first node to the ground according to a voltage of the feedback node;
a first normally-off transistor, comprising a source terminal, a gate terminal, and a drain terminal, wherein the source terminal is coupled to the first node, the gate terminal is coupled to the high-side node, and the drain terminal is supplied by the supply voltage;
a second normally-off transistor, comprising a source terminal, a gate terminal, and a drain terminal, wherein the source terminal is coupled to the ground, the gate terminal receives the first internal signal, and the drain terminal is coupled to the first node;
a first capacitor, coupled between the first node and the high-side node;
a third normally-off transistor, comprising a source terminal, a gate terminal, and a drain terminal, wherein the source terminal is coupled to the high-side node, the gate terminal receives the second internal signal, and the drain terminal is supplied by the supply voltage; and
a fourth normally-off transistor, comprising a source terminal, a gate terminal, and a drain terminal, wherein the source terminal is coupled to the ground, the gate terminal receives the first internal signal, and the drain terminal is coupled to the high-side node.

31. The circuit of claim 30, wherein when the second internal signal is at a high voltage level, the first internal signal is at a low voltage level, and the driving voltage is at the low voltage level, the voltage of the feedback node is raised by the first normally-on transistor to turn ON the first switch, so that the first capacitor is charged by the supply voltage through the third normally-off transistor and the first switch and the first node is charged by the first normally-off transistor, wherein when the high-side voltage is raised to turn ON the first normally-off transistor, a voltage of the first node is raised to boost the high-side voltage for fully turning ON the high-side transistor, wherein when the driving voltage is raised to turn ON the feedback normally-off transistor, the first switch is turned OFF, such that the voltage of the first node is raised to the supply voltage.

32. The circuit of claim 27, wherein the second bootstrap circuit comprises:
a fifth normally-off transistor, comprising a source terminal, a gate terminal, and a drain terminal, wherein the source terminal is coupled to the first internal node, the gate terminal is coupled to a second node, and the drain terminal is supplied by the supply voltage;
a sixth normally-off transistor, comprising a source terminal, a gate terminal, and a drain terminal, wherein the source terminal is coupled to the ground, the gate terminal receives the second internal signal, and the drain terminal is coupled to the first internal node;
a second capacitor, coupled between a third node and the first internal node;
a first unidirectional conducting device, unidirectionally providing the supply voltage to the third node;
a first resistor, coupled between the second node and the third node; and
a second switch, configured to electrically connect the second node to the ground according to the second internal signal.

33. The circuit of claim 32, wherein when the second internal signal is at a high voltage level, the sixth normally-off transistor and the second switch are turned ON and the second capacitor is charged by the supply voltage through the first unidirectional conducting device and the sixth normally-off transistor, wherein when the second internal signal is at a low voltage level, the sixth normally-off transistor and the second switch are turned OFF, the first resistor provides a voltage of the third node to the second node to turn ON the fifth normally-off transistor, wherein when the fifth normally-off transistor is turned ON to raise the first internal signal, the voltage of the third node is equal to a sum of a voltage across the second capacitor and the first internal signal for fully turning ON the fifth transistor.

34. The circuit of claim 32, wherein the second bootstrap circuit further comprises:
a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

35. The circuit of claim 27, wherein the second bootstrap circuit comprises:
a fifth normally-off transistor, comprising a source terminal, a gate terminal, and a drain terminal, wherein the source terminal is coupled to the first internal node, the gate terminal is coupled to a second node, and the drain terminal is supplied by the supply voltage;
a sixth normally-off transistor, comprising a source terminal, a gate terminal, and a drain terminal, wherein the source terminal is coupled to the ground, the gate terminal receives the second internal signal, and the drain terminal is coupled to the first internal node;

a second unidirectional conducting device, unidirectionally providing the supply voltage to a third node;
a third capacitor, coupled between the third node and a charge node;
a discharge resistor, coupled between the second node and the third node;
a third unidirectional conducting device, unidirectionally electrically connecting the charge node to the second node when a voltage of the charge node exceeds a voltage of the second node;
a fourth unidirectional conducting device, unidirectionally providing the first internal signal to the charge node when the first internal signal exceeds a voltage of the charge node; and
a third switch, receiving the control signal and configured to couple the high-side node to the ground according to the control signal.

36. The circuit of claim 35, wherein each of the second unidirectional conducting device, the third unidirectional conducting device, and the fourth unidirectional conducting device is a diode or a diode-connected normally-off transistor.

37. The circuit of claim 35, wherein when the second internal signal is at a high voltage level, the third switch is turned ON and the third capacitor is charged by the supply voltage through the second unidirectional conducting device, the third unidirectional conducting device, and the third switch, wherein when the second internal signal is at a low voltage level, the third switch is turned OFF, the fourth unidirectional conducting device provides the first internal signal to the charge node, and the third capacitor is discharged to the second node through the discharge resistor.

38. The circuit of claim 35, wherein the second bootstrap circuit further comprises:
a second normally-on transistor, comprising a source terminal, a gate terminal, and a drain terminal, wherein the source terminal and the gate terminal are coupled to the first internal node and the drain terminal is supplied by the supply voltage, wherein the second normally-on transistor is configured to improve the driving capability of the fifth normally-off transistor.

39. The circuit of claim 27, wherein the first bootstrap circuit further comprises:
a high-side normally-on transistor, comprising a source terminal coupled to the driving node, a gate terminal coupled to the driving node, and a drain terminal supplied by the supply voltage, wherein the high-side normally-on transistor is configured to improve the driving capability of the high-side transistor.

40. The circuit of claim 27, wherein the pre-driver comprises:
a driving normally-on transistor, comprising a source terminal, a gate terminal, and a drain terminal, wherein the gate terminal and the source terminal are coupled to the second internal node and the drain terminal is supplied by the supply voltage; and
a seventh normally-off transistor, comprising a source terminal, a gate terminal, and a drain terminal, wherein the gate terminal receives the third internal signal, a source terminal is coupled to the ground, and the drain terminal is coupled to the second internal node.

41. The circuit of claim 27, wherein the hysteresis circuit comprises:
a second resistor, coupled between the supply voltage and the third internal node;

an eighth normally-off transistor, comprising a gate terminal coupled to a fourth node, a source terminal coupled to a fifth node, and a drain terminal coupled to the second resistor;

a ninth normally-off transistor, comprising a gate terminal coupled to the fourth node, a source terminal coupled to the ground, and a drain terminal coupled to the fifth node;

a tenth normally-off transistor, comprising a gate terminal coupled to the drain terminal of the eighth normally-off transistor, a source terminal coupled to the fifth node, and a drain terminal supplied by the supply voltage; and a third resistor, providing the control signal to the fourth node.

* * * * *